United States Patent
Jeon

(10) Patent No.: US 9,947,735 B2
(45) Date of Patent: Apr. 17, 2018

(54) DISPLAY DEVICE AND METHOD OF MANUFACTURING THE SAME

(71) Applicant: Samsung Display Co., Ltd., Yongin-si, Gyeonggi-do (KR)

(72) Inventor: Hee-Chul Jeon, Hwaseong-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/136,572

(22) Filed: Apr. 22, 2016

(65) Prior Publication Data

US 2017/0092708 A1    Mar. 30, 2017

(30) Foreign Application Priority Data

Sep. 30, 2015    (KR) .................... 10-2015-0137474

(51) Int. Cl.
| | |
|---|---|
| H01L 21/00 | (2006.01) |
| H01L 27/14 | (2006.01) |
| H01L 29/04 | (2006.01) |
| H01L 29/15 | (2006.01) |
| H01L 31/036 | (2006.01) |
| H01L 27/32 | (2006.01) |
| H01L 51/56 | (2006.01) |
| H01L 27/12 | (2006.01) |

(52) U.S. Cl.
CPC ........ *H01L 27/3262* (2013.01); *H01L 27/127* (2013.01); *H01L 27/3258* (2013.01); *H01L 27/3276* (2013.01); *H01L 51/56* (2013.01); *H01L 2227/323* (2013.01); *H01L 2251/5338* (2013.01)

(58) Field of Classification Search
CPC .................................................. H01L 27/3262
USPC ............................................. 257/72; 438/30
See application file for complete search history.

(56) References Cited

U.S. PATENT DOCUMENTS

| | | | |
|---|---|---|---|
| 2014/0029017 A1* | 1/2014 | Lee ........................ | G01B 11/24 356/601 |
| 2014/0097408 A1* | 4/2014 | Kim .................... | H01L 27/3237 257/40 |
| 2014/0098549 A1 | 4/2014 | Hack et al. | |
| 2014/0217373 A1* | 8/2014 | Youn ................... | H01L 23/4985 257/40 |
| 2014/0300529 A1* | 10/2014 | Kim ...................... | H01L 27/326 345/80 |
| 2014/0306941 A1* | 10/2014 | Kim .................... | H04M 1/0268 345/204 |

(Continued)

*Primary Examiner* — Igwe U Anya
(74) *Attorney, Agent, or Firm* — Knobbe, Martens, Olson & Bear, LLP

(57) ABSTRACT

A display device and a method of manufacturing the same are disclosed. In one aspect, the display device includes a display area configured to display an image and a bending area adjacent to the display area. The display device is bendable along the bending area; a flexible base substrate. A thin film transistor is disposed over the base substrate, and an insulation layer is disposed over the base substrate and covering the thin film transistor. The bending area includes a stress distribution region having opposing end portions and a central portion. Each of the opposing end portions has a width larger than the width of the central portion, and the width of each opposing end increases as a function of distance from the central portion.

21 Claims, 18 Drawing Sheets

(56) References Cited

U.S. PATENT DOCUMENTS

2015/0187279 A1* 7/2015 Lee ..................... G09G 3/3225
257/40
2015/0382446 A1* 12/2015 Kwon ................... H05K 1/028
174/251

* cited by examiner

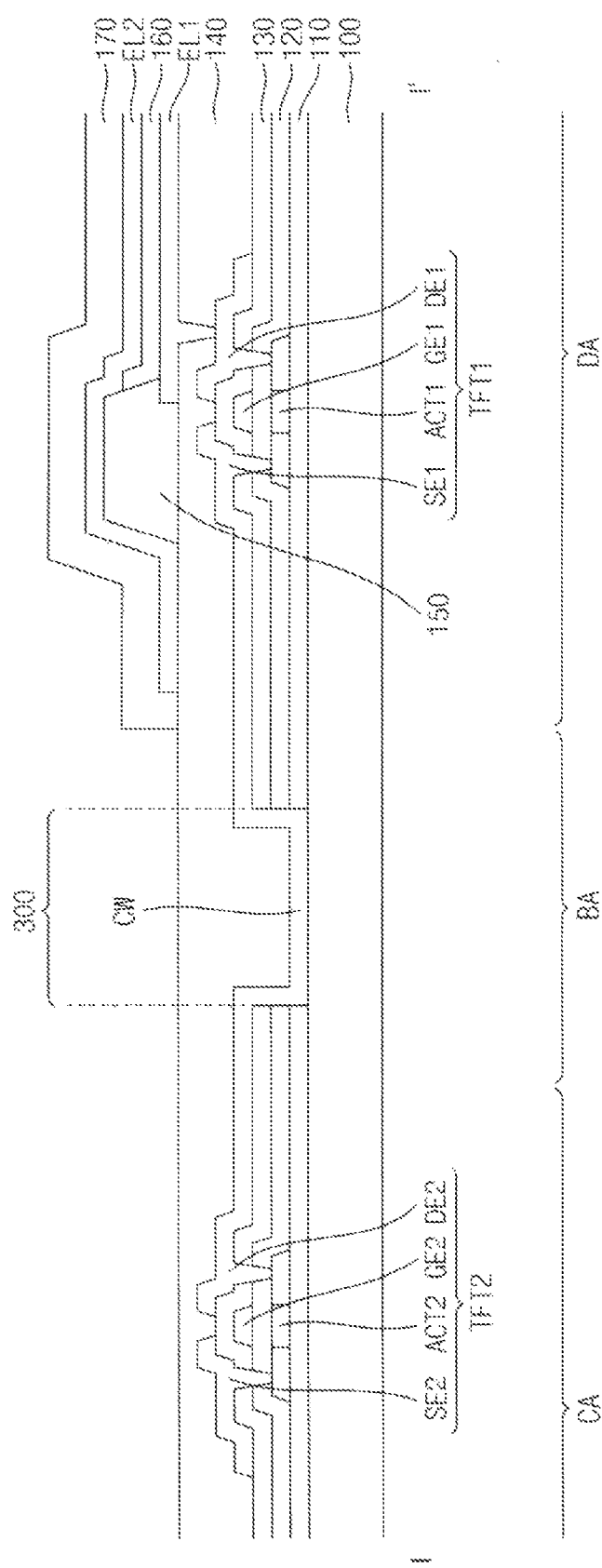

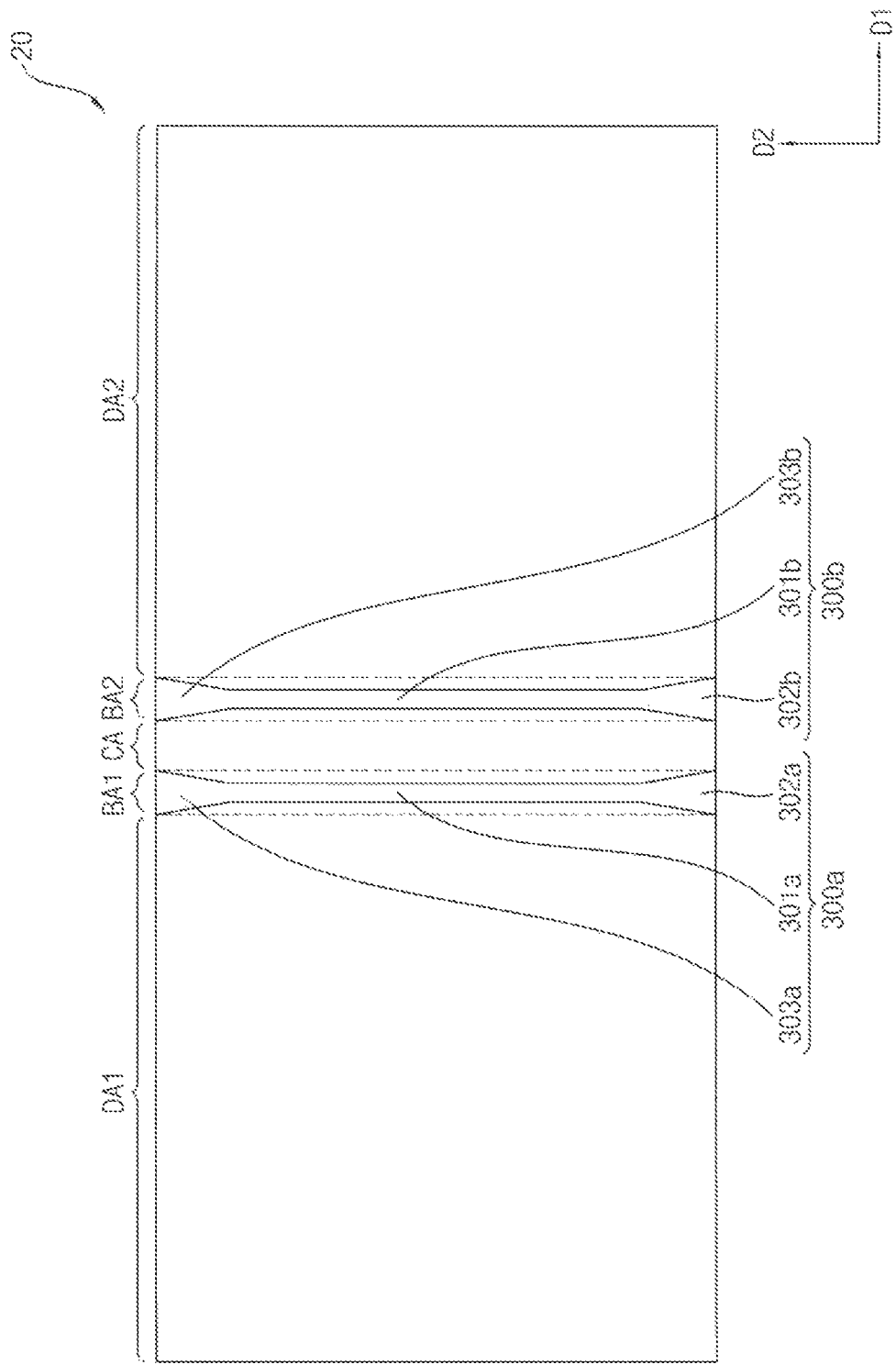

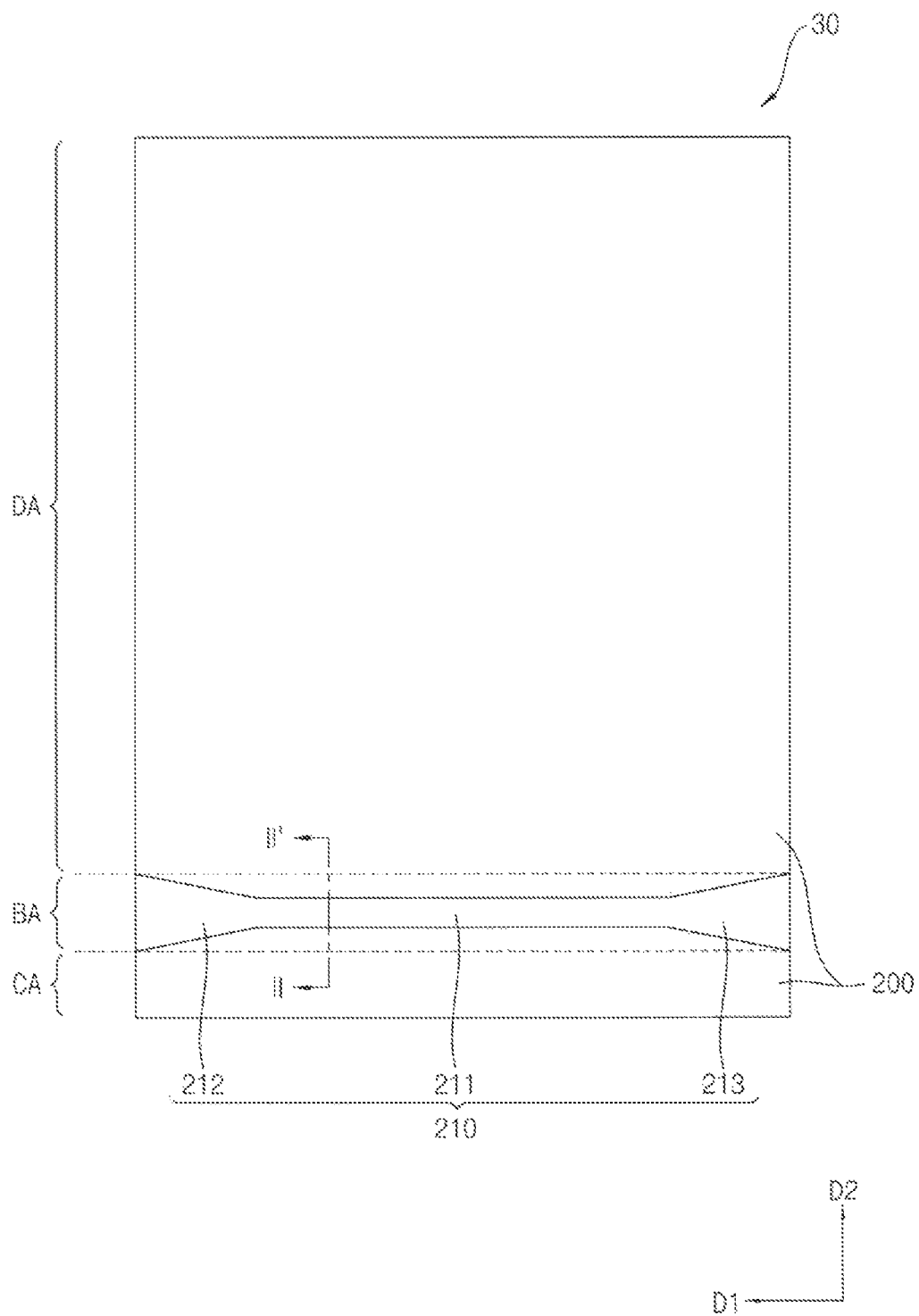

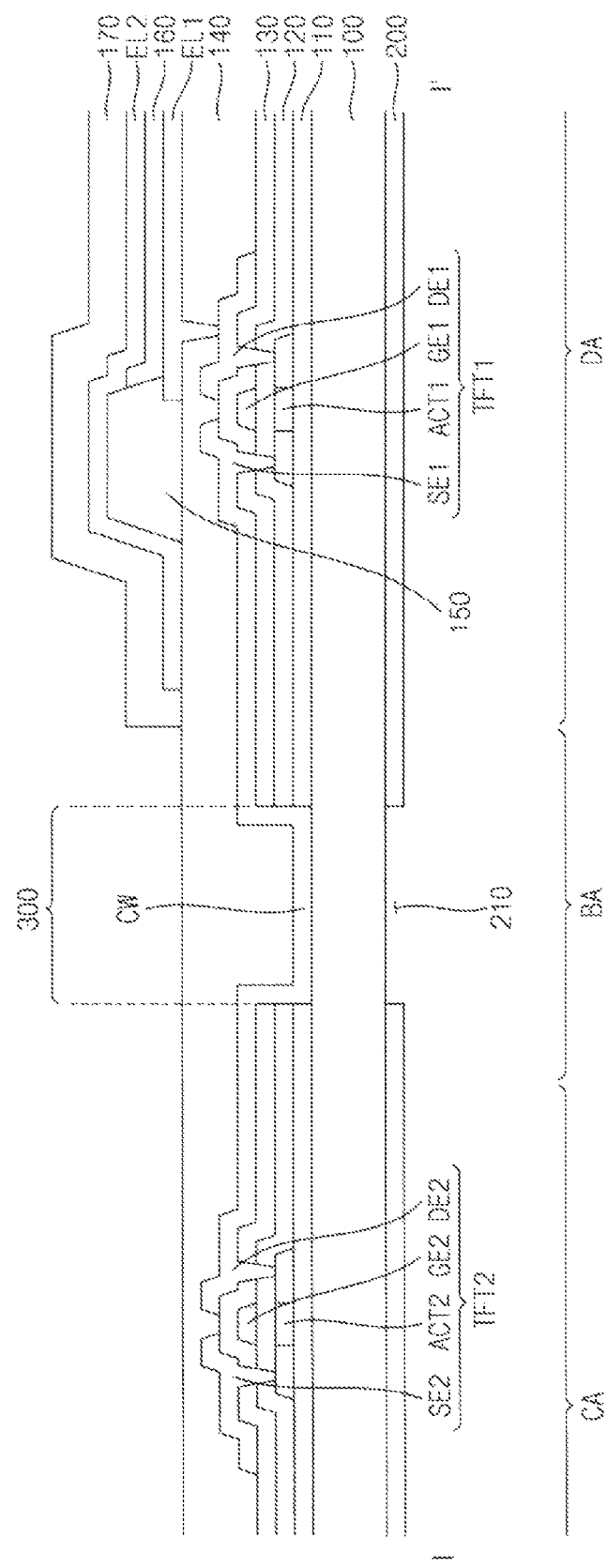

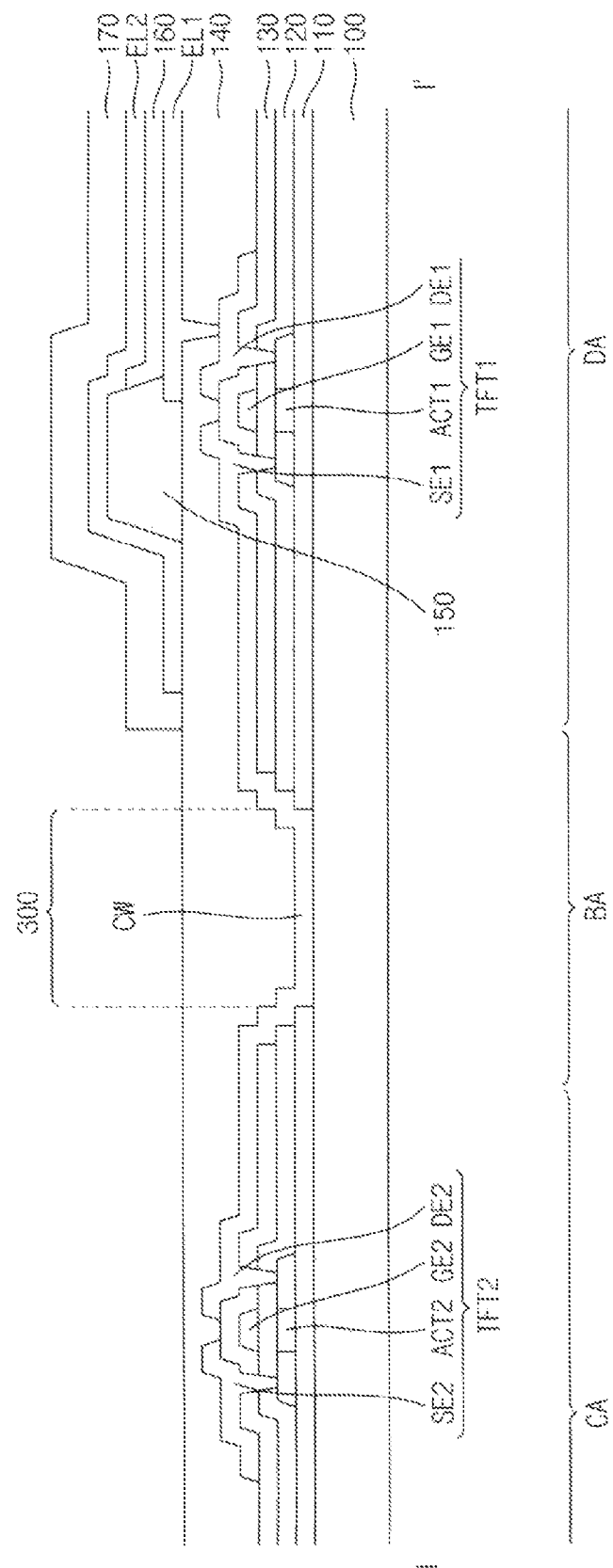

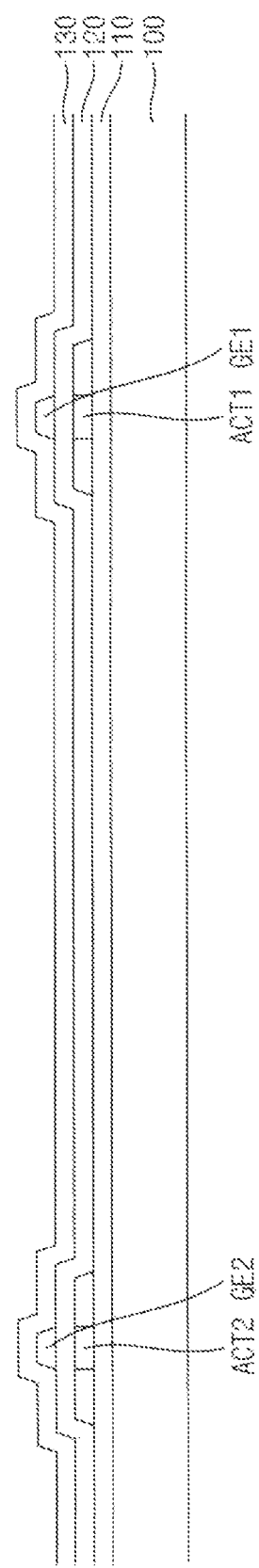

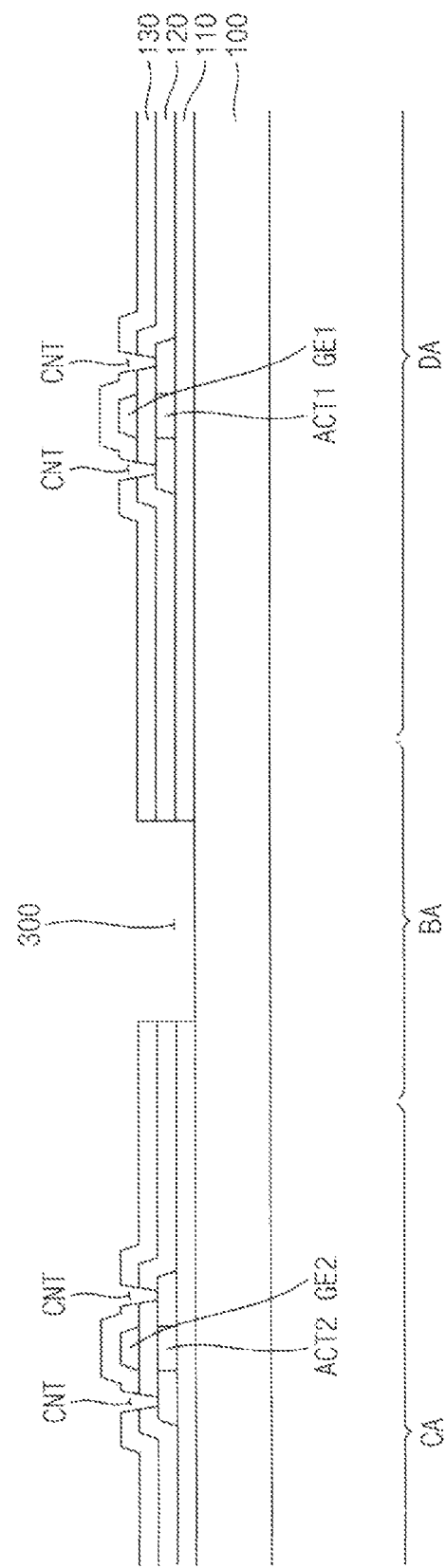

DISPLAY DEVICE AND METHOD OF MANUFACTURING THE SAME

CROSS-REFERENCE TO RELATED APPLICATION

This application claims priority under 35 U.S.C. § 119 to Korean Patent Application No. 10-2015-0137474, filed on Sep. 30, 2015, the disclosure of which is incorporated by reference herein in its entirety.

BACKGROUND

Field

The described technology generally relates to a display device and a method of manufacturing the same.

Description of the Related Technology

A display device generates an image using many pixels that emit light. An organic light-emitting diode (OLED) display includes pixels having OLEDs. An OLED emits light having a wavelength that depends on the organic material included in the OLED. Typically, organic material is chosen according to one of red color light, green color light, and blue color light. The OLED display generates an image by mixing the colors emitted by the organic materials.

Recently, bendable displays have been developed. A portion of a bendable display can be bent, so that it can be used in various non-traditional applications. However, stress can be concentrated on the bent portion, where the bendable display can be damaged.

SUMMARY OF CERTAIN INVENTIVE ASPECTS

One inventive aspect relates to a display device that can reduce damage due to concentration of stress.

Another aspect is a method of manufacturing the display device.

Another aspect is a display device that includes a display area to display an image and a bending area. The display device is bendable in the bending area. The display device includes a base substrate including flexible material, a thin film transistor disposed on the base substrate, and an insulation layer disposed on the base substrate to cover the thin film transistor and including an inorganic insulation material. The bending area includes a stress distribution area extended in a direction which is in parallel with a boundary between the display area and the bending area. Width of stress distribution at both end portions of the stress distribution area is larger than width of the stress distribution at a central portion of the stress distribution area.

In an exemplary embodiment, the insulation layer is not formed at the stress distribution area.

In an exemplary embodiment, the display device further includes a circuit area. The bending area can be disposed between the display area and the circuit area. The display device can further include a first thin film transistor disposed in the display area, a second thin film transistor disposed in the circuit area, and a connecting wire disposed in the bending area to electrically connect the first thin film transistor to the second thin film transistor.

In an exemplary embodiment, the first thin film transistor includes a first source electrode and a first drain electrode. The second thin film transistor can include a second source electrode and a second drain electrode. The first and second source electrodes of the first and second thin film transistors and the connecting wire can be formed from a same layer and have same material.

In an exemplary embodiment, the insulation layer includes a first insulation layer disposed on the base substrate and including an inorganic insulation material, and a second insulation layer disposed on the first insulation layer and including an inorganic insulation material.

In an exemplary embodiment, the display device further includes a planarization layer disposed on the second insulation layer and entirely covering the display area and the bending area.

In an exemplary embodiment, the first insulation layer and the second insulation layer forms a stepwise shape in the stress distribution area.

In an exemplary embodiment, a plurality of openings are defined through the insulation layer in the stress distribution area.

In an exemplary embodiment, the stress distribution area has a curved side.

In an exemplary embodiment, the display device further includes a protecting layer disposed on a bottom surface of the base substrate.

In an exemplary embodiment, a blank pattern is formed on the protecting layer in the stress distribution area.

In an exemplary embodiment, a plurality of openings are defined through the protecting layer in the stress distribution area.

In an exemplary embodiment, the display area includes a first display area and a second display area spaced apart from the first display area. The bending area can be disposed between the first display area and the second display area.

In an exemplary embodiment, the inorganic insulation material is silicon nitride or silicon oxide.

Another aspect is a display device that includes a display area to display and image and a bending area which is bendable and disposed adjacent to the display area. A method of manufacturing the display device includes forming a pattern which is included on a thin film transistor on a base substrate, forming an insulation layer which includes an inorganic insulation material, and forming a stress distribution area by removing a portion of the insulation layer. The bending area includes a stress distribution area extended in a direction which is in parallel with a boundary between the display area and the bending area. Width of stress distribution at both end portions of the stress distribution area is larger than width of the stress distribution at a central portion of the stress distribution area.

In an exemplary embodiment, the stress distribution area is entirely removed in the stress distribution area.

In an exemplary embodiment, the method further includes forming a connecting wire on the insulation layer on which the stress distribution area is formed.

In an exemplary embodiment, in forming the stress distribution area, a plurality of openings are formed through the insulation layer in the stress distribution area.

In an exemplary embodiment, the method further includes attaching a protecting layer on a bottom surface of the base substrate. A plurality of openings can be formed through the protecting layer in the stress distribution area.

Another aspect is a display device that includes a display area to display an image and a bending area. The display device is bendable in the bending area. The display device includes a base substrate including flexible material, a thin film transistor disposed on the base substrate, and a pixel structure disposed on the base substrate to display the image in the display area. A stress distribution area is formed along the bending area. Width of stress distribution at both end portions of the stress distribution area is larger than width of the stress distribution at a central portion of the stress distribution area.

Another aspect is a display device comprising: a display area configured to display an image; a bending area adjacent to the display area, wherein the display device is bendable along the bending area; a flexible base substrate; a thin film transistor (TFT) disposed over the base substrate; and an insulation layer disposed over the base substrate and covering the thin film transistor, the insulation layer formed of an inorganic insulation material, wherein the bending area comprises a stress distribution region having opposing end portions and a central portion, wherein each of the opposing end portions has a width larger than the width of the central portion, and wherein the width of each opposing end increases as a function of distance from the central portion.

In the above display device, the insulation layer is not formed in the stress distribution region.

The above display device further comprises: a circuit area, wherein the bending area is interposed between the display area and the circuit area; a first TFT disposed in the display area; a second TFT disposed in the circuit area; and a connecting wire disposed in the bending area and configured to electrically connect the first and second TFTs.

In the above display device, the first TFT comprises a first source electrode and a first drain electrode, wherein the second TFT comprises a second source electrode and a second drain electrode, and wherein the first and second source electrodes and the connecting wire are formed on the same layer and formed of the same material.

In the above display device, the insulation layer comprises: a first insulation layer disposed over the base substrate and formed of the inorganic insulation material; and a second insulation layer disposed over the first insulation layer and formed of the inorganic insulation material.

The above display device further comprises a planarization layer disposed over the second insulation layer and entirely covering the display area and the bending area.

In the above display device, the first and second insulation layers together have a step shape in the stress distribution region.

In the above display device, the insulation layer has a plurality of openings formed in the stress distribution region.

In the above display device, the stress distribution region has a curved side.

The above display device further comprises a protecting layer disposed over a bottom surface of the base substrate.

In the above display device, the protecting layer is not formed in the stress distribution region.

In the above display device, the protecting layer has a plurality of openings formed in the stress distribution region.

In the above display device, the display area comprises a first display area and a second display area spaced apart from each other, wherein the bending area is interposed between the first and second display areas.

In the above display device, the inorganic insulation material includes silicon nitride or silicon oxide.

Another aspect is a method of manufacturing a display device which comprises a display area configured to display an image and a bending area which is bendable and disposed adjacent to the display area, the method comprising: patterning a semiconductor layer to form a thin film transistor (TFT) over a base substrate; forming an insulation layer formed of an inorganic insulation material; and removing a portion of the insulation layer in the bending area so as to form a stress distribution region, wherein the stress distribution region having opposing end portions and a central portion, wherein each of the opposing end portions has a width larger than the width of the central portion, and wherein the width of each opposing end increases a function of distance from the central portion.

In the above method, the semiconductor layer is entirely removed in the stress distribution region.

The above method further comprises forming a connecting wire over the insulation layer in the stress distribution region.

The above method further comprises forming a plurality of openings in the insulation layer in the stress distribution region.

The above method further comprises: attaching a protecting layer over a bottom surface of the base substrate; and forming a plurality of openings in the protecting layer in the stress distribution region.

Another aspect is a display device comprising: a display area configured to display an image; a bending area adjacent to the display area, wherein the display device is bendable along the bending area; a flexible base substrate; a thin film transistor (TFT) disposed over the base substrate; and a pixel structure disposed over the base substrate and configured to display the image, wherein the bending area includes a stress distribution region having opposing end portions and a central portion, wherein each of the opposing end portions has a width larger than the width of the central portion, wherein the width of each opposing end increases as a function of distance from the central portion, and wherein the width of the central portion is substantially uniform.

According to at least one of the disclosed embodiments, a display device can include a display area and a bending area. The bending area can include a stress distribution area, and both end portions of the stress distribution area can have wider width than width at a central portion of the stress distribution area. Accordingly, when the bending area is bent, damage can be reduced due to the stress distribution area.

BRIEF DESCRIPTION OF THE DRAWINGS

FIG. 1B is a cross-sectional view taken along a line I-I' of FIG. 1A.

FIG. 4 is a plan view illustrating a display device according to another exemplary embodiment.

FIG. 5A is a bottom view of the display device of FIG. 4.

FIG. 5B is a cross-sectional view taken along a line I-I' of FIG. 5A.

FIG. 8B is a cross-sectional view taken along a line I-I' of FIG. 8A.

FIGS. 9A, 9B, 9C, 9D, 9E, 9F and 9G are cross-sectional views illustrating a method of manufacturing the display device of FIGS. 1A and 1B.

DETAILED DESCRIPTION OF CERTAIN INVENTIVE EMBODIMENTS

Hereinafter, the described technology will be explained in detail with reference to the accompanying drawings.

Figure 1A:
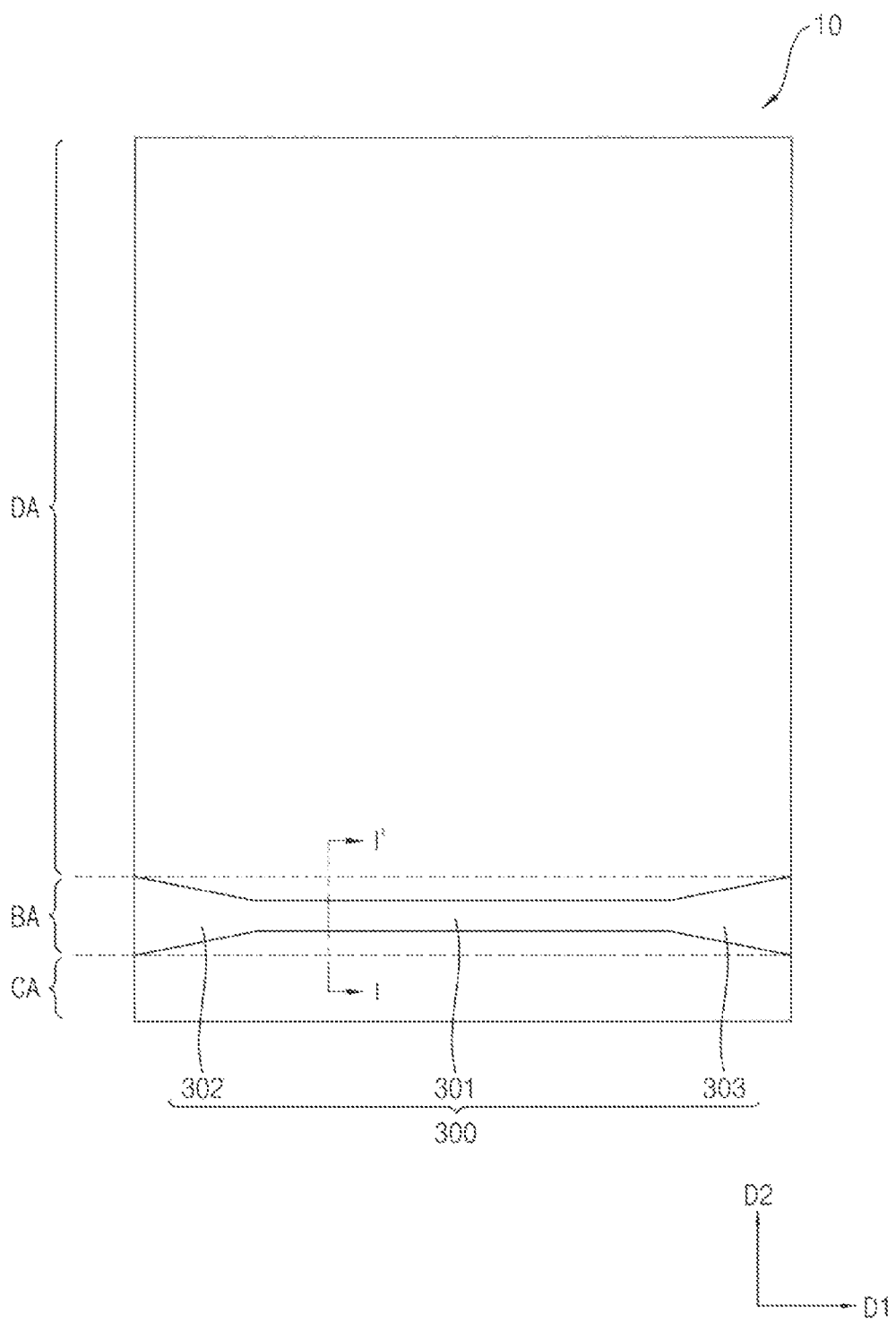
FIG. 1A is a plan view illustrating a display device according to an exemplary embodiment.

FIG. 1A is a plan view illustrating a display device 10 according to an exemplary embodiment. FIG. 1B is a cross-sectional view taken along a line I-I' of FIG. 1A.

Referring to FIGS. 1A and 1B, the display device 10 includes a base substrate 100, a buffer layer 110, a first and second thin film transistors TFT1 and TFT2, a first insulation layer 120, a gate pattern, a second insulation layer 130, a data pattern, a planarization layer 140, a first electrode EL1, a pixel defining layer 150, a light emitting structure 160, a second electrode EL2 and a sealing layer 170.

The base substrate 100 can include a flexible insulation substrate. For example, the base substrate 100 includes resin substrate, etc. Examples of the resin substrate for the base substrate 100 can include polyimide-based resin, acryl-based resin, polyacrylate-based resin, polycarbonate-based resin, polyether-based resin, sulfonic acid containing resin, polyethyleneterephthalate-based resin, etc.

The buffer layer 110 can be disposed on the base substrate 100. The buffer layer 110 can prevent diffusion of metal atoms and/or impurities from the base substrate 100. Additionally, the buffer layer 110 can adjust heat transfer rate of a successive crystallization process for an active pattern, to thereby obtain a substantially uniform active pattern. When the base substrate 100 can have a relatively irregular surface, the buffer layer 110 can improve flatness of the surface of the base substrate 100. The buffer layer 110 can be formed using a silicon compound. For example, the buffer layer 110 is formed of silicon oxide (SiOx), silicon nitride (SiNx), silicon oxynitride (SiOxNy), silicon oxycarbide (SiOxCy), silicon carbon nitride (SiCxNy), etc. These can be used alone or in a mixture thereof. The buffer layer 110 can have a single layer structure or a multi layer structure. For example, the buffer layer 110 can have a single-layered structure formed of a silicon oxide film, a silicon nitride film, a silicon oxynitride film, a silicon oxycarbide film or a silicon carbon nitride film. Alternatively, the buffer layer 110 can have a multilayered structure formed of at least two of a silicon oxide film, a silicon nitride film, a silicon oxynitride film, a silicon oxycarbide film, a silicon carbon nitride film, etc.

The active pattern can be disposed on the buffer layer 110. The active pattern can include a first active pattern ACT1 of the first thin film transistor TFT1 and a second active pattern ACT2 of the second thin film transistor TFT2.

The active pattern can be formed of silicon (Si). In another example embodiment, the active pattern is formed of a semiconductor oxide containing a binary compound (ABx), a ternary compound (ABxCy) and/or a quaternary compound (ABxCyDz). For example, the active pattern includes indium (In), zinc (Zn), gallium (Ga), stannum (Sn), titanium (Ti), aluminum (Al), hafnium (Hf), zirconium (Zr) and/or magnesium (Mg).

The first insulation layer 120 can be disposed on the buffer layer 110 to cover the active pattern. The first insulation layer 120 can include an inorganic insulation material. For example, the first insulation layer 120 is formed of a silicon compound such as silicon oxide (SiOx), silicon nitride (SiNx), silicon oxynitride (SiOxNy), silicon oxycarbide (SiOxCy), silicon carbonitride (SiCxNy). In example embodiments, the first insulation layer 120 is uniformly formed on the buffer layer 110 along a profile of the active pattern. Here, the first insulation layer 120 can have a substantially small thickness, such that a stepped portion can be formed at a portion of the first insulation layer 120 adjacent to the active pattern. In some example embodiments, the first insulation layer 120 has a relatively large thickness for sufficiently covering the active pattern, so that the first insulation layer 120 has a substantially level surface.

The gate pattern can be disposed on the first insulation layer 120. The gate pattern can include a first gate electrode GE1 of the first thin film transistor TFT1 and a second gate electrode GE2 of the second thin film transistor TFT2. The first gate electrode GE1 can overlap the first active pattern ACT1. The second gate electrode GE2 can overlap the second active pattern ACT2.

The gate pattern can be formed of metal, alloy, conductive metal oxide, a transparent conductive material, etc. For example, the gate pattern can be formed using aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These can be used alone or in a combination thereof. In example embodiments, the gate pattern can have a single layer structure or a multi layer structure, which can include a metal film, an alloy film, a metal nitride film, a conductive metal oxide film and/or a transparent conductive film.

The second insulation layer 130 can be disposed on the first insulation layer 120 to cover the gate pattern. The second insulation layer 130 can include an inorganic insulation material. For example, the second insulation layer 130 is formed of a silicon compound such as silicon oxide (SiOx), silicon nitride (SiNx), silicon oxynitride (SiOxNy), silicon oxycarbide (SiOxCy), silicon carbonitride (SiCxNy). In example embodiments, the second insulation layer 130 is uniformly formed on the first insulation layer 120 along a profile of the gate pattern. Here, the second insulation layer 130 can have a substantially small thickness, such that a stepped portion can be formed at a portion of the second insulation layer 130 adjacent to the gate pattern. In some example embodiments, the second insulation layer 130 has a relatively large thickness for sufficiently covering the gate pattern, so that the second insulation layer 130 can have a substantially level surface.

A stress distribution area 300 can be formed by removing a portion of the buffer layer 110, a portion of the first insulation layer 120 and a portion of the second insulation layer 130. For example, an opening is formed through the buffer layer 110, the first insulation layer 120 and the second insulation layer 130 in the stress distribution area 300.

The data pattern can be formed on the second insulation layer 130. The data pattern can include a first source electrode SE1 and a first drain electrode DE1 of the first thin film transistor TFT1, a second source electrode SE2 and a second drain electrode DE2 of the second thin film transistor TFT2), and a connecting wire CW.

The first source electrode SE1 can be electrically connected to the first active pattern ACT1 through contact holes formed through the first and second insulation layers 120 and 130. The first drain electrode DE1 can be electrically connected to the first active pattern ACT1 through contact holes formed through the first and second insulation layers 120 and 130.

The second source electrode SE2 can be electrically connected to the second active pattern ACT2 through contact holes formed through the first and second insulation layers 120 and 130. The second drain electrode DE2 can be electrically connected to the second active pattern ACT2 through contact holes formed through the first and second insulation layers 120 and 130.

The connecting wire CW can electrically connect the first thin film transistor TFT1 and the second thin film transistor TFT2 each other. The connecting wire CW can be disposed on the second insulation layer 130. The connecting wire CW can be disposed on the base substrate 100 in the stress distribution area 300. The opening is formed through the buffer layer 110, the first layer 120 and the second insulation layer 130 in the stress distribution area 300, so that the connecting wire CW can be disposed along the second insulation layer 130, a side surface of the second insulation layer 130, a side surface of the first insulation layer 120, a side surface of the buffer layer 110 and an upper surface of the base substrate 120. Thus, the first thin film transistor TFT1 in a display area DA and the second thin film transistor TFT2 in a circuit area CA can be connected by the connecting wire CW.

The planarization layer 140 can be disposed on the second insulation layer 130 on which the thin film transistors are disposed. The planarization layer 140 can be formed in all of the display area DA, a bending area BA and a circuit area CA, so that the planarization layer 140 can fill the opening in the stress distribution area 300. The planarization layer 140 can have a single-layered structure or a multi-layered structure including at least two insulation films. The planarization layer 140 can be formed using an organic material. For example, the planarization layer 140 is formed of photoresist, acryl-based resin, polyimide-based resin, polyamide-based resin, siloxane-based resin, etc. These can be used alone or in a combination thereof.

The first electrode EL1 can be disposed on the planarization layer 140. The first electrode EL1 can be electrically connected to the first drain electrode DE1 through a contact hole formed through the planarization layer 140.

The first electrode EL1 can be formed of a reflective material or a transmissive material in accordance with the emission type of the display device. For example, the first electrode EL1 is formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These can be used alone or in a combination thereof. In example embodiments, the first electrode EL1 has a single layer structure or a multi layer structure, which can include a metal film, an alloy film, a metal nitride film, a conductive metal oxide film and/or a transparent conductive film.

The pixel defining layer 150 can be disposed on the planarization layer 140 on which the first electrode EL1 is disposed. The pixel defining layer 150 can define an opening which exposes the first electrode EL1. The pixel defining layer 150 can include an organic material or an inorganic material. For example, the pixel defining layer 150 is formed using photoresist, acryl-based resin, polyacryl-based resin, polyimide-based resin, a silicon compound, etc.

The light emitting structure 160 can be positioned on the first electrode EL1 exposed by the opening of the pixel defining layer 150. The light emitting structure 160 can extend on a sidewall of the opening of the pixel defining layer 150. The light emitting structure 160 can be formed by a laser induced thermal imaging process, a printing process, etc. The light emitting structure 160 can include an organic light emitting layer (EL), a hole injection layer (HIL), a hole transfer layer (HTL), an electron transfer layer (ETL), an electron injection layer (EIL), etc. In example embodiments, a plurality of organic light emitting layers are formed using light emitting materials for generating different colors of light such as a red color of light (R), a green color of light (G) and a blue color of light (B) in accordance with color pixels of the display device. In some example embodiments, the organic light emitting layer of the of the light emitting structure 160 includes a plurality of stacked light emitting materials for generating a red color of light, a green color of light and a blue color of light to thereby emit a white color of light.

The second electrode EL2 can be disposed on the pixel defining layer 150 and the light emitting structure 160. The second electrode EL2 can be formed of a transmissive material or a reflective material in accordance with the emission type of the display device. For example, the second electrode EL2 can be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These can be used alone or in a combination thereof. In example embodiments, the second electrode EL2 can also have a single layer structure or a multi layer structure, which can include a metal film, an alloy film, a metal nitride film, a conductive metal oxide film and/or a transparent conductive film.

The sealing layer 170 can be disposed on the planarization layer 140 and the second electrode EL2 to cover the second electrode EL2.

The sealing layer 170 can be configured to prevent ambient air and moisture from permeating into the transparent OLED display. The sealing layer 170 can have a structure in which a layer formed of an inorganic material such as silicon oxide or silicon nitride and a layer such as epoxy or polyimide are alternately stacked. However the described technology not limited thereto, and the structure of the sealing layer can be one of any sealing structure in the form of a transparent thin film.

In some example embodiment, a sealing substrate facing the base substrate 100 is disposed on the second electrode EL2. The sealing substrate can be formed of transparent material and be configured to prevent ambient air and moisture from permeating into the transparent OLED display. The sealing substrate can be combined to the base substrate 100 to seal space between the base substrate 100 and the sealing substrate by a sealing agent (not shown). A desiccant or a filler can be filled into the space.

Referring again to FIG. 1A, the display device includes the display area DA, the circuit area CA and the bending area BA.

An image can be displayed on the display area DA. A structure for displaying the image can be disposed in the display area DA. For example, a pixel structure including the first thin film transistor TFT1 and the light emitting structure 160 can be disposed in the display area DA, so that the image can be displayed.

The circuit area CA can be disposed in a boundary area of the display device. The circuit area CA can be spaced apart from the display area DA in a second direction D2 which crosses a first direction D1. The second direction D2 can be substantially perpendicular to the first direction D1. The circuit area CA can be extended in the first direction D1 along the boundary of the display device. A driving circuit including the second thin film transistor TFT2 for driving the pixel structure can be disposed in the circuit area CA.

The bending area BA can be disposed between the circuit area CA and the display area DA. The bending area BA can extend in the first direction D1. The display device can be bent in the bending area BA, so that the display device can have L or C shape in a cross-sectional view perpendicular to the first direction D1. The display device can be bent in the bending area BA, so that various applications of the display device can be possible.

The bending area BA can include the stress distribution area 300. The stress distribution area 300 can include first to third areas 301, 302 and 303.

The first area 301 can be disposed between the second area 302 and the third area 303 in the first direction D1. The width of the first area 301 in the second direction D2 can be smaller than the width of the second area 302 and the width of third area 303. Thus, the stress distribution area 300 can have a greater width at a boundary of the display device than at a central portion of the display device.

When the bending area BA of the display device is bent, stress can generally be concentrated at both end portions of the bending area BA in the first direction D1. The width of the stress distribution area 300 is larger at the both end portions, so that stress can be distributed. Accordingly, damage caused by bending can be reduced.

The stress distribution area 300 can be a portion where the buffer layer 110, the first insulation layer 120 and the second insulation layer 130 are removed. Generally, damage of a bendable display device caused by bending can occur at an inorganic insulation layer. In the display device according to the present example embodiment, layers formed by inorganic insulation material can be removed in the stress distribution area 300, so that damage caused by bending can be reduced.

Figure 2:
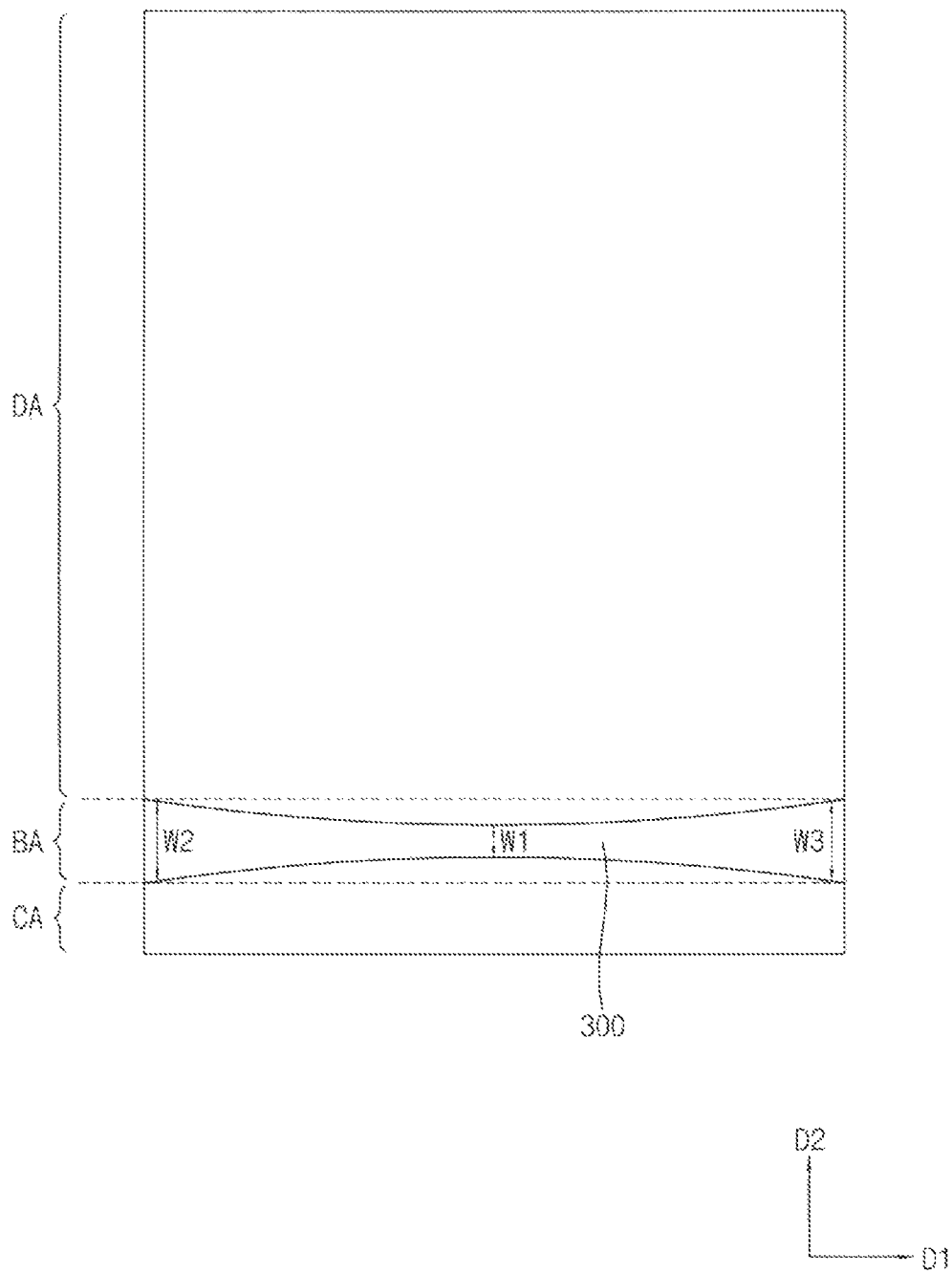
FIG. 2 is a plan view illustrating a display device according to an exemplary embodiment.

FIG. 2 is a plan view illustrating a display device according to an exemplary embodiment.

Referring to FIGS. 2 and 1B, the display device can be substantially the same as the display device of FIGS. 1A and 1B except for a stress distribution area 300. Thus, any further detailed descriptions concerning the same elements will be briefly described or omitted.

The display device includes a base substrate 100, a buffer layer 110, a first and second thin film transistors TFT1 and TFT2, a first insulation layer 120, a gate pattern, a second insulation layer 130, a data pattern, a planarization layer 140, a first electrode EL1, a pixel defining layer 150, a light emitting structure 160, a second electrode EL2 and a sealing layer 170.

The base substrate 100 can include a flexible insulation substrate. For example, the base substrate 100 includes resin substrate, etc.

The buffer layer 110 can be disposed on the base substrate 100.

The active pattern can be disposed on the buffer layer 110. The active pattern can include a first active pattern ACT1 of the first thin film transistor TFT1 and a second active pattern ACT2 of the second thin film transistor TFT2.

The first insulation layer 120 can be disposed on the buffer layer 110 to cover the active pattern. The first insulation layer 120 can be formed of an inorganic insulation material.

The gate pattern can be disposed on the first insulation layer 120. The gate pattern can include a first gate electrode GE1 of the first thin film transistor TFT1 and a second gate electrode GE2 of the second thin film transistor TFT2.

The second insulation layer 130 can be disposed on the first insulation layer 120 to cover the gate pattern. The second insulation layer 130 can be formed of an inorganic insulation material.

The stress distribution area 300 can be formed by removing a portion of the buffer layer 110, a portion of the first insulation layer 120 and a portion of the second insulation layer 130. For example, an opening is formed through the buffer layer 110, the first insulation layer 120 and the second insulation layer 130 in the stress distribution area 300.

The data pattern can be formed on the second insulation layer 130. The data pattern can include a first source electrode SE1 and a first drain electrode DE1 of the first thin film transistor TFT1, a second source electrode SE2 and a second drain electrode DE2 of the second thin film transistor TFT2), and a connecting wire CW.

The planarization layer 140 can be disposed on the second insulation layer 130 on which the thin film transistors are disposed.

The first electrode EL1 can be disposed on the planarization layer 140. The pixel defining layer 150 can be disposed on the planarization layer 140 on which the first electrode EL1 is disposed. The light emitting structure 160 can be positioned on the first electrode EL1 exposed by an opening of the pixel defining layer 150. The second electrode EL2 can be disposed on the pixel defining layer 150 and the light emitting structure 160. The sealing layer 170 can be disposed on the planarization layer 140 and the second electrode EL2 to cover the second electrode EL2.

Referring again to FIG. 2, the display device includes the display area DA, the circuit area CA and the bending area BA.

An image can be displayed on the display area DA. The circuit area CA can be disposed at a boundary of the display device, and can be spaced apart from the display area DA in a second direction D2 which crosses a first direction D1. The bending area BA can be disposed between the circuit area CA and the display area DA. The bending area BA can extend in the first direction D1.

The bending area BA can include the stress distribution area 300. The stress distribution area 300 can have a first width w1 at a central portion, and have a second width w2 and a third width w3 at both end portions in the first direction D1. For example, the stress distribution area 300 has the first width w1 at the central portion, and have the second width w2 and the third width w3 at the both end portions, so that the stress distribution area 300 can have a curved side. The first width w1 can be smaller than the second width w2 and the third width w3. Thus, the width of the stress distribution area 300 can be greater at the both end portions than at the central portions.

The stress distribution area 300 can be a portion where the buffer layer 110, the first insulation layer 120 and the second insulation layer 130 are removed.

Figure 3:
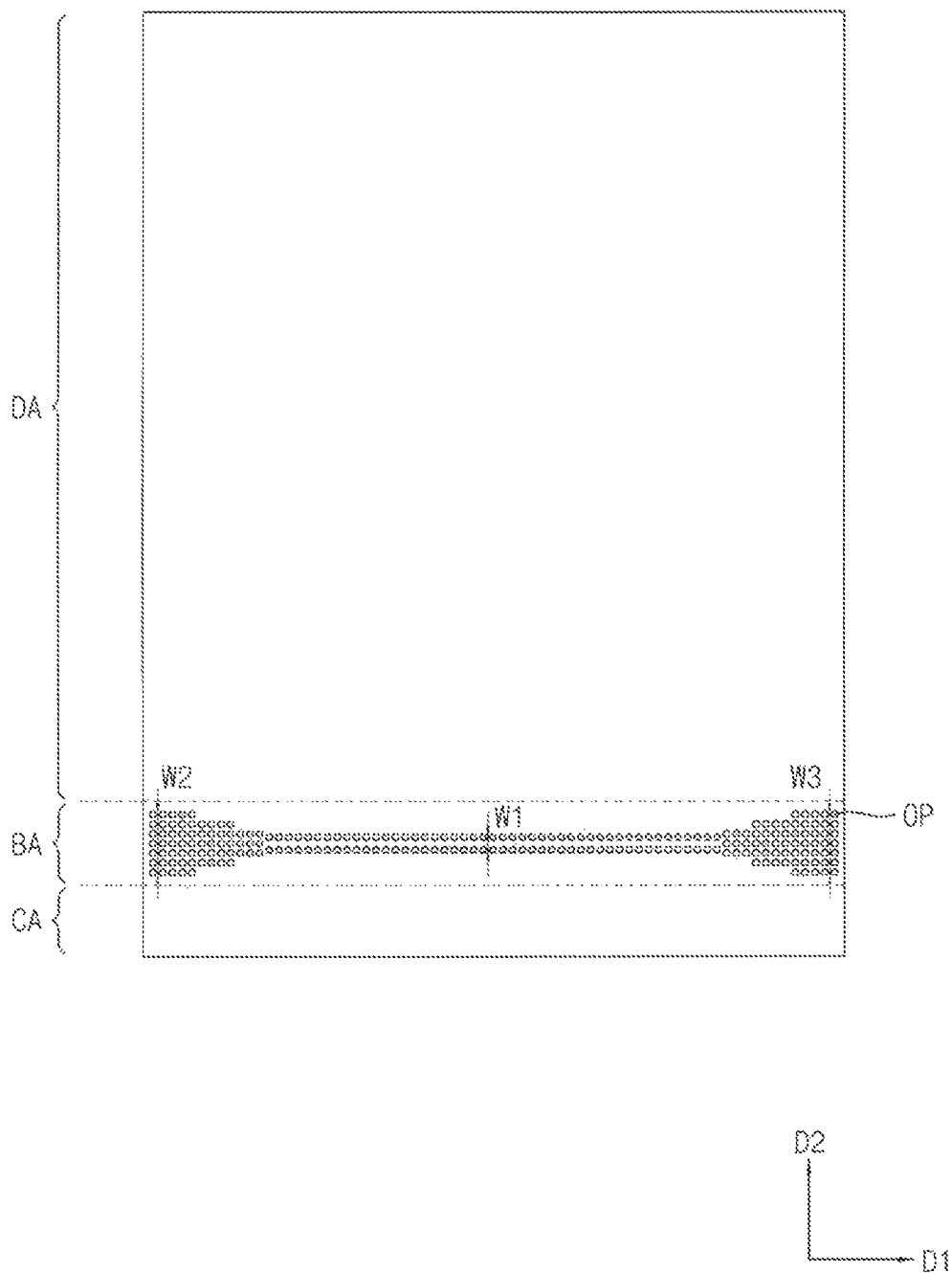
FIG. 3 is a plan view illustrating a display device according to an exemplary embodiment.

FIG. 3 is a plan view illustrating a display device according to an exemplary embodiment.

Referring to FIGS. 3 and 1B, the display device can be substantially the same as the display device of FIGS. 1A and 1B except for a stress distribution area 300. Thus, any further detailed descriptions concerning the same elements will be briefly described or omitted.

The display device includes a base substrate 100, a buffer layer 110, a first and second thin film transistors TFT1 and TFT2, a first insulation layer 120, a gate pattern, a second insulation layer 130, a data pattern, a planarization layer 140, a first electrode EL1, a pixel defining layer 150, a light emitting structure 160, a second electrode EL2 and a sealing layer 170.

The base substrate 100 can include a flexible insulation substrate. For example, the base substrate 100 can include resin substrate, etc.

The buffer layer 110 can be disposed on the base substrate 100.

The active pattern can be disposed on the buffer layer 110. The active pattern can include a first active pattern ACT1 of the first thin film transistor TFT1 and a second active pattern ACT2 of the second thin film transistor TFT2.

The first insulation layer 120 can be disposed on the buffer layer 110 to cover the active pattern. The first insulation layer 120 can be formed of an inorganic insulation material.

The gate pattern can be disposed on the first insulation layer 120. The gate pattern can include a first gate electrode GE1 of the first thin film transistor TFT1 and a second gate electrode GE2 of the second thin film transistor TFT2.

The second insulation layer 130 can be disposed on the first insulation layer 120 to cover the gate pattern. The second insulation layer 130 can be formed of an inorganic insulation material.

The data pattern can be formed on the second insulation layer 130. The data pattern can include a first source electrode SE1 and a first drain electrode DE1 of the first thin film transistor TFT1, a second source electrode SE2 and a second drain electrode DE2 of the second thin film transistor TFT2), and a connecting wire CW.

The planarization layer 140 can be disposed on the second insulation layer 130 on which the thin film transistors are disposed.

The first electrode EL1 can be disposed on the planarization layer 140. The pixel defining layer 150 can be disposed on the planarization layer 140 on which the first electrode EL1 is disposed. The light emitting structure 160 can be positioned on the first electrode EL1 exposed by an opening of the pixel defining layer 150. The second electrode EL2 can be disposed on the pixel defining layer 150 and the light emitting structure 160. The sealing layer 170 can be disposed on the planarization layer 140 and the second electrode EL2 to cover the second electrode EL2.

Referring again to FIG. 3, the display device includes the display area DA, the circuit area CA and the bending area BA.

An image can be displayed on the display area DA. The circuit area CA can be disposed at a boundary of the display device, and can be spaced apart from the display area DA in a second direction D2 which crosses a first direction D1. The bending area BA can be disposed between the circuit area CA and the display area DA. The bending area BA can extend in the first direction D1.

The bending area BA can include the stress distribution area 300. The stress distribution area 300 can have a first width w1 at a central portion, and have a second width w2 and a third width w3 at both end portions in the first direction D1. For example, the stress distribution area 300 has the first width w1 at the central portion, and the second width w2 and the third width w3 at the both end portions, so that the stress distribution area 300 can have a curved side. The first width w1 can be smaller than the second width w2 and the third width w3. Thus, the width of the stress distribution area 300 can be greater at the both end portions than at the central portions.

The stress distribution area 300 can be a portion where a plurality of openings OP formed through the buffer layer 110, the first insulation layer 120 and the second insulation layer 130. Thus, the openings OP which expose the base substrate 100 can be formed through the buffer layer 110, the first insulation layer 120 and the second insulation layer 130 in the stress distribution area 300. Generally, damage of a bendable display device caused by bending can be occurred at an inorganic insulation layer. In the display device according to the present example embodiment, a plurality of openings are formed through inorganic layers in the stress distribution area 300, so that damage caused by bending can be reduced.

FIG. 4 is a plan view illustrating a display device 30 according to another exemplary embodiment.

Referring to FIG. 4, the display device 30 can be substantially the same as the display device 10 of FIGS. 1A and 1B except for locations of display area, circuit area and bending area. Thus, any further detailed descriptions concerning the same elements will be briefly described or omitted.

The display device 20 includes a first display area DA1, a second display area DA2, a circuit area CA, a first bending area BA1 and a second bending area BA2.

A first image can be displayed on the first display area DA1. A display element to display the first image can be disposed in the first display area DA1. For example, a pixel structure including a thin film transistor and a light emitting structure can be disposed in the first display area DA1, so that the first image can be displayed.

A second image can be displayed on the second display area DA2. A display element to display the second image can be disposed in the second display area DA2. For example, a pixel structure including a thin film transistor and a light emitting structure is disposed in the second display area DA2, so that the second image is displayed.

The second display area DA2 can be spaced apart from the first display area DA1 in a second direction D2 which crosses a first direction D1. The second direction D2 can be substantially perpendicular to (or cross) the first direction D1.

The circuit area CA can be disposed between the first display area DA1 and the second display area DA2. The circuit area CA can be extended in the first direction D1. A driving circuit to drive the pixel structure can be disposed in the circuit area CA.

The first bending area BA1 can be disposed between the first display area DA1 and the circuit area CA. The first bending area BA1 can be extended in the first direction D1.

The second bending area BA2 can be disposed between the second display area DA2 and the second display area DA2. The second bending area BA2 can be extended in the first direction D1.

The display device can be bent in the first and second bending areas BA1 and BA2, so that the display device can have L or C shape in a cross-sectional view perpendicular to the first direction D1. The display device can be bent in the first and second bending areas BA1 and BA2, so that various applications of the display device can be possible.

The first bending area BA1 can include the first stress distribution area 300a. The first stress distribution area 300a can include first to third areas 301a, 302a and 303a.

The first area 301a can be disposed between the second area 302a and the third area 303a in the first direction D1. The width of the first area 301a in the second direction D2 can be smaller than the width of the second area 302a and the width of third area 303a. Thus, the stress distribution area 300 can have a wider width at a boundary of the display device than at a central portion of the display device.

The first stress distribution area 300a can be a portion where the buffer layer, the first insulation layer and the second insulation layer are removed. In some example embodiments, the first stress distribution area 300a has various shapes and structure such as example embodiments of FIGS. 2 and 3.

The second bending area BA2 can include the second stress distribution area 300b. The second stress distribution area 300b can include first to third areas 301b, 302b and 303b.

The first area 301b can be disposed between the second area 302b and the third area 303b in the first direction D1. The width of the first area 301b in the second direction D2 can be smaller than the width of the second area 302b and the width of third area 303b. Thus, the first stress distribution area 300b can have a wider width at a boundary of the display device than at a central portion of the display device.

The second stress distribution area 300b can be a portion where the buffer layer, the first insulation layer and the second insulation layer are removed. In some example embodiments, the second stress distribution area 300b has various shapes and structure such as example embodiments of FIGS. 2 and 3.

FIG. 5A is a bottom view of the display device 20. FIG. 5B is a cross-sectional view taken along a line I-I' of FIG. 5A.

Referring to FIGS. 5A and 5B, the display device includes a base substrate 100, a buffer layer 110, a first and second thin film transistors TFT1 and TFT2, a first insulation layer 120, a gate pattern, a second insulation layer 130, a data pattern, a planarization layer 140, a first electrode EL1, a pixel defining layer 150, a light emitting structure 160, a second electrode EL2, a sealing layer 170 and a protecting layer 200.

The base substrate 100 can include a flexible insulation substrate. For example, the base substrate 100 includes resin substrate, etc. Examples of the resin substrate for the base substrate 100 include polyimide-based resin, acryl-based resin, polyacrylate-based resin, polycarbonate-based resin, polyether-based resin, sulfonic acid containing resin, polyethyleneterephthalate-based resin, etc.

The buffer layer 110 can be disposed on the base substrate 100. The buffer layer 110 can prevent diffusion of metal atoms and/or impurities from the base substrate 100. Additionally, the buffer layer 110 can adjust heat transfer rate of a successive crystallization process for an active pattern, to thereby obtain a substantially uniform active pattern. When the base substrate 100 has a relatively uneven surface, the buffer layer 110 can improve flatness of the surface of the base substrate 100. The buffer layer 110 can be formed using a silicon compound. For example, the buffer layer 110 is formed of silicon oxide (SiOx), silicon nitride (SiNx), silicon oxynitride (SiOxNy), silicon oxycarbide (SiOxCy), silicon carbon nitride (SiCxNy), etc. These can be used alone or in a mixture thereof. The buffer layer 110 can have a single layer structure or a multi layer structure. For example, the buffer layer 110 has a single-layered structure including a silicon oxide film, a silicon nitride film, a silicon oxynitride film, a silicon oxycarbide film or a silicon carbon nitride film. Alternatively, the buffer layer 110 can have a multilayered structure including at least two of a silicon oxide film, a silicon nitride film, a silicon oxynitride film, a silicon oxycarbide film, a silicon carbon nitride film, etc.

The active pattern can be disposed on the buffer layer 110. The active pattern can include a first active pattern ACT1 of the first thin film transistor TFT1 and a second active pattern ACT2 of the second thin film transistor TFT2.

The active pattern can include silicon (Si). In another example embodiment, the active pattern includes a semiconductor oxide containing a binary compound (ABx), a ternary compound (ABxCy) and/or a quaternary compound (ABxCyDz). For example, the active pattern can include indium (In), zinc (Zn), gallium (Ga), stannum (Sn), titanium (Ti), aluminum (Al), hafnium (Hf), zirconium (Zr) and/or magnesium (Mg).

The first insulation layer 120 can be disposed on the buffer layer 110 to cover the active pattern. The first insulation layer 120 can include an inorganic insulation material. For example, the first insulation layer 120 includes a silicon compound such as silicon oxide (SiOx), silicon nitride (SiNx), silicon oxynitride (SiOxNy), silicon oxycarbide (SiOxCy), silicon carbonitride (SiCxNy). In example embodiments, the first insulation layer 120 is uniformly formed on the buffer layer 110 along a profile of the active pattern. Here, the first insulation layer 120 can have a substantially small thickness, such that a stepped portion can be formed at a portion of the first insulation layer 120 adjacent to the active pattern. In some example embodiments, the first insulation layer 120 has a relatively large thickness for sufficiently covering the active pattern, so that the first insulation layer 120 can have a substantially level surface.

The gate pattern can be disposed on the first insulation layer 120. The gate pattern can include a first gate electrode GE1 of the first thin film transistor TFT1 and a second gate electrode GE2 of the second thin film transistor TFT2. The first gate electrode GE1 can overlap the first active pattern ACT1. The second gate electrode GE2 can overlap the second active pattern ACT2.

The gate pattern can be formed of metal, alloy, conductive metal oxide, a transparent conductive material, etc. For example, the gate pattern is formed using aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (no), tin oxide (SnOx), indium oxide (InOx), gallium oxide (GaOx), indium zinc oxide (IZO), etc. These can be used alone or in a combination thereof. In example embodiments, the gate pattern has a single layer structure or a multi layer structure, which can include a metal film, an alloy film, a metal nitride film, a conductive metal oxide film and/or a transparent conductive film.

The second insulation layer 130 can be disposed on the first insulation layer 120 to cover the gate pattern. The second insulation layer 130 can be formed of an inorganic insulation material. For example, the second insulation layer 130 includes a silicon compound such as silicon oxide (SiOx), silicon nitride (SiNx), silicon oxynitride (SiOxNy), silicon oxycarbide (SiOxCy), silicon carbonitride (SiCxNy). In example embodiments, the second insulation layer 130 is uniformly formed on the first insulation layer 120 along a profile of the gate pattern. Here, the second insulation layer 130 can have a substantially small thickness, such that a stepped portion can be formed at a portion of the second insulation layer 130 adjacent to the gate pattern. In some example embodiments, the second insulation layer 130 has a relatively large thickness for sufficiently covering the gate pattern, so that the second insulation layer 130 can have a substantially level surface.

A stress distribution area 300 can be formed by removing a portion of the buffer layer 110, a portion of the first insulation layer 120 and a portion of the second insulation layer 130. For example, an opening is formed through the buffer layer 110, the first insulation layer 120 and the second insulation layer 130 in the stress distribution area 300.

The data pattern can be formed on the second insulation layer 130. The data pattern can include a first source electrode SE1 and a first drain electrode DE1 of the first thin film transistor TFT1, a second source electrode SE2 and a second drain electrode DE2 of the second thin film transistor TFT2), and a connecting wire CW.

The first source electrode SE1 can be electrically connected to the first active pattern ACT1 through contact holes formed through the first and second insulation layers 120 and 130. The first drain electrode DE1 can be electrically connected to the first active pattern ACT1 through contact holes formed through the first and second insulation layers 120 and 130.

The second source electrode SE2 can be electrically connected to the second active pattern ACT2 through contact holes formed through the first and second insulation layers 120 and 130. The second drain electrode DE2 can be electrically connected to the second active pattern ACT2 through contact holes formed through the first and second insulation layers 120 and 130.

The connecting wire CW can electrically connect the first thin film transistor TFT1 and the second thin film transistor TFT2 each other. The connecting wire CW can be disposed on the second insulation layer 130. The connecting wire CW can be disposed on the base substrate 100 in the stress distribution area 300. The opening is formed through the buffer layer 110, the first layer 120 and the second insulation layer 130 in the stress distribution area 300, so that the connecting wire CW can be disposed along the second insulation layer 130, a side surface of the second insulation layer 130, a side surface of the first insulation layer 120, a side surface of the buffer layer 110 and an upper surface of the base substrate 120. Thus, the first thin film transistor TFT1 in a display area DA and the second thin film transistor TFT2 in a circuit area CA can be connected by the connecting wire CW.

The planarization layer 140 can be disposed on the second insulation layer 130 on which the thin film transistors are disposed. The planarization layer 140 can be formed in all of the display area DA, a bending area BA and a circuit area CA, so that the planarization layer 140 can fill the opening in the stress distribution area 300. The planarization layer 140 can have a single-layered structure or a multi-layered structure including at least two insulation films. The planarization layer 140 can be formed using an organic material. For example, the planarization layer 140 includes photoresist, acryl-based resin, polyimide-based resin, polyamide-based resin, siloxane-based resin, etc. These can be used alone or in a combination thereof.

The first electrode EL1 can be disposed on the planarization layer 140. The first electrode EL1 can be electrically connected to the first drain electrode DE1 through a contact hole formed through the planarization layer 140.

The first electrode EL1 can be formed of a reflective material or a transmissive material in accordance with the emission type of the display device. For example, the first electrode EL1 is formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These can be used alone or in a combination thereof. In example embodiments, the first electrode EL1 has a single layer structure or a multi layer structure, which can include a metal film, an alloy film, a metal nitride film, a conductive metal oxide film and/or a transparent conductive film.

The pixel defining layer 150 can be disposed on the planarization layer 140 on which the first electrode EL1 is disposed. The pixel defining layer 150 can define an opening which exposes the first electrode EL1. The pixel defining layer 150 can be formed of an organic material or an inorganic material. For example, the pixel defining layer 150 is formed using photoresist, acryl-based resin, polyacryl-based resin, polyimide-based resin, a silicon compound, etc.

The light emitting structure 160 can be positioned on the first electrode EL1 exposed by the opening of the pixel defining layer 150. The light emitting structure 160 can extend on a sidewall of the opening of the pixel defining layer 150. The light emitting structure 160 can be formed by a laser induced thermal imaging process, a printing process, etc. The light emitting structure 160 can include an organic light emitting layer (EL), a hole injection layer (HIL), a hole transfer layer (HTL), an electron transfer layer (ETL), an electron injection layer (EIL), etc. In example embodiments, a plurality of organic light emitting layers is formed using light emitting materials for generating different colors of light such as a red color of light (R), a green color of light (G) and a blue color of light (B) in accordance with color pixels of the display device. In some example embodiments, the organic light emitting layer of the of the light emitting structure 160 includes a plurality of stacked light emitting materials for generating a red color of light, a green color of light and a blue color of light to thereby emit a white color of light.

The second electrode EL2 can be disposed on the pixel defining layer 150 and the light emitting structure 160. The second electrode EL2 can include a transmissive material or a reflective material in accordance with the emission type of the display device. For example, the second electrode EL2 is formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These can be used alone or in a combination thereof. In example embodiments, the second electrode EL2 also has a single layer structure or a multi layer structure, which can include a metal film, an alloy film, a metal nitride film, a conductive metal oxide film and/or a transparent conductive film.

The sealing layer 170 can be disposed on the planarization layer 140 and the second electrode EL2 to cover the second electrode EL2.

The sealing layer 170 can be configured to prevent ambient air and moisture from permeating into the transparent OLED display. The sealing layer 170 can have a structure in which a layer formed of an inorganic material such as silicon oxide or silicon nitride and a layer such as epoxy or polyimide are alternately stacked. However the described technology is not limited thereto, and the structure of the sealing layer can be one of any sealing structure in the form of a transparent thin film.

In some example embodiment, a sealing substrate facing the base substrate 100 is disposed on the second electrode EL2. The sealing substrate can be formed of transparent material and be configured to prevent ambient air and moisture from permeating into the transparent OLED display. The sealing substrate can be combined to the base substrate 100 to seal space between the base substrate 100 and the sealing substrate by a sealing agent (not shown). A desiccant or a filler can be filled into the space.

The protecting layer 200 can be disposed on a bottom surface of the base substrate 100 to protect bottom surface of the display device. The protecting layer 200 can be a resin layer to protect the display device from external shock. For example, the protecting layer 200 is formed of polyimide-based resin.

The protecting layer 200 can define a blank pattern 210 in the bending area BA. The blank pattern 210 can be a portion where the protecting layer 200 is not formed. For example, the protecting layer 200 includes a first portion and a second portion. The first portion can be disposed in the display area DA and in a portion of the bending area BA, and the second portion can be disposed in the circuit area CA and a portion of the bending area BA, so that the blank pattern 210 can be defined between the first portion and the second portion.

Referring again to FIG. 5A, the display device includes the display area DA, the circuit area CA and the bending area BA.

An image can be displayed on the display area DA. A structure for displaying the image can be disposed in the display area DA. For example, a pixel structure including the first thin film transistor TFT1 and the light emitting structure 160 are disposed in the display area DA, so that the image can be displayed.

The circuit area CA can be disposed in a boundary area of the display device. The circuit area CA can be spaced apart from the display area DA in a second direction D2 which crosses a first direction D1. The second direction D2 can be substantially perpendicular to or cross the first direction D1. The circuit area CA can extend in the first direction D1 along the boundary of the display device. A driving circuit including the second thin film transistor TFT2 for driving the pixel structure can be disposed in the circuit area CA.

The bending area BA can be disposed between the circuit area CA and the display area DA. The bending area BA can extend in the first direction D1. The display device can be bent in the bending area BA, so that the display device can have L or C shape in a cross-sectional view perpendicular to the first direction D1. The display device can be bent in the bending area BA, so that various applications of the display device can be possible.

The bending area BA can be disposed between the circuit area CA and the display area DA. The bending area BA can extend in the first direction D1. The display device can be bent in the bending area BA, so that the display device can have L or C shape in a cross-sectional view perpendicular to the first direction D1. The display device can be bent in the bending area BA, so that various applications of the display device can be possible.

The bending area BA can include the stress distribution area 300. The stress distribution area 300 can have a wider width at a boundary of the display device than at a central portion of the display device.

When the bending area BA of the display device is bent, stress can generally be concentrated at both end portions of the bending area BA in the first direction D1. The width of the stress distribution area 300 is larger at the both end portions, so that stress can be distributed. Accordingly, damage caused by bending can be reduced.

The stress distribution area 300 can be a portion where the buffer layer 110, the first insulation layer 120 and the second insulation layer 130 are removed. Generally, damage of a bendable display device caused by bending can be occurred at an inorganic insulation layer. In the display device according to the present example embodiment, layers formed by inorganic insulation material can be removed in the stress distribution area 300, so that damage caused by bending can be reduced.

The blank pattern 210 of the protecting layer 200 can be defined in the bending area BA on the bottom surface of the display device corresponding to the stress distribution area 300. The blank pattern 210 can include a first area 211, a second area 212 and an area portion 213.

The first area 211 can be disposed between the second area 212 and the third area 212 in the first direction D1. The width of the first area 211 along the second direction D2 can be smaller than the width of the second and third areas 212 and 213. Thus, width of the blank pattern 210 can be greater at a central portion of the display device then at a boundary of the display device.

When the bending area BA of the display device is bent, stress can generally be concentrated at both end portions of the bending area BA in the first direction D1. The width of the blank pattern 210 is larger at the both end portions, so that stress can be distributed. Accordingly, damage caused by bending can be reduced.

An adhesive layer (not shown) can further be disposed between the protecting layer 200 and the base substrate 100. The adhesive layer can include pressure-sensitive adhesive. Accordingly, the protecting layer 200 with the adhesive layer attached thereon can be attached on the bottom surface of the base substrate 100, so that the display device can be formed.

Figure 6:
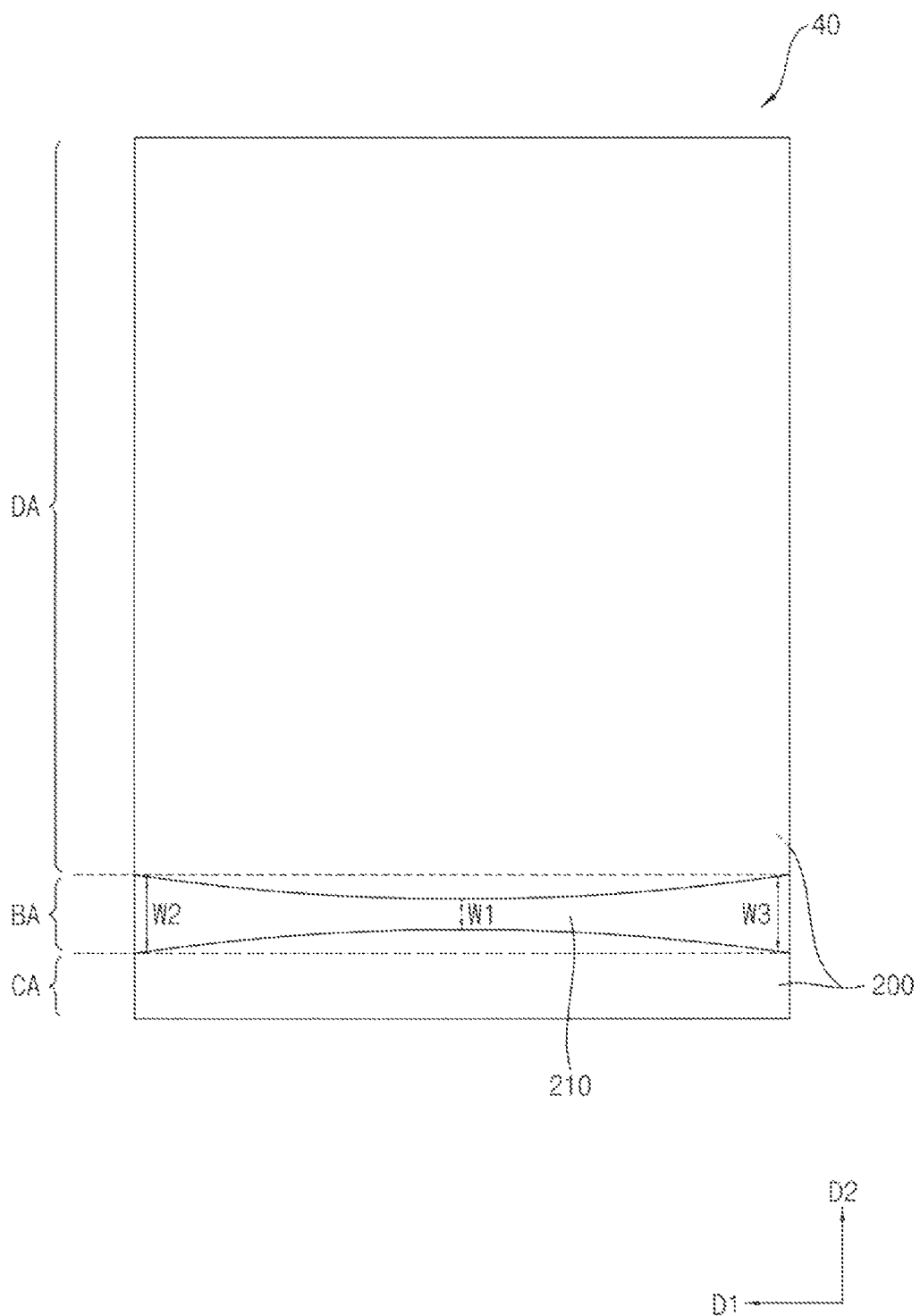
FIG. 6 is a bottom view illustrating a display device according to another exemplary embodiment.

FIG. 6 is a bottom view illustrating a display device 30 according to another exemplary embodiment.

Referring to FIG. 6, the display device 30 can be substantially the same as the display device 20 of FIGS. 5A and 5B except for a blank pattern 210. Thus, any further detailed descriptions concerning the same elements will be briefly described or omitted.

The display device 30 includes a base substrate, a buffer layer, a first and second thin film transistors, a first insulation layer, a data pattern, a second insulation layer, a planarization layer, a first electrode, a pixel defining layer, a light emitting structure, a second electrode, a sealing layer and a protecting layer 200.

The display device 30 can include a display area DA, a circuit area CA and a bending area BA.

The protecting layer 200 can define a blank pattern 210 in the bending area BA. The blank pattern 210 can be a portion where the protecting layer 200 is not formed. For example, the protecting layer 200 includes a first portion and a second portion, the first portion is disposed in the display area DA and in a portion of the bending area BA, and the second portion is disposed in the circuit area CA and a portion of the bending area BA, so that the blank pattern 210 can be defined between the first portion and the second portion.

The blank pattern 210 can have a first width w1 at a central portion, and have a second width w2 and a third width w3 at both end portions in the first direction D1. For example, the blank pattern 210 has the first width w1 at the central portion, and has the second width w2 and the third width w3 at both end portions, so that the blank pattern 210 can have a curved side. The first width w1 can be smaller than the second width w2 and the third width w3. Thus, the width of the blank pattern 210 can be greater at the both end portions than at the central portions.

When the bending area BA of the display device is bent, stress can generally be concentrated at both end portions of the bending area BA in the first direction D1. The width of the blank pattern 210 is larger at the both end portions, so that stress can be distributed. Accordingly, damage caused by bending can be reduced.

An adhesive layer (not shown) can further be disposed between the protecting layer 200 and the base substrate 100. The adhesive layer can include pressure-sensitive adhesive. Accordingly, the protecting layer 200 with the adhesive layer attached thereon can be attached on the bottom surface of the base substrate 100, so that the display device can be formed.

Figure 7:
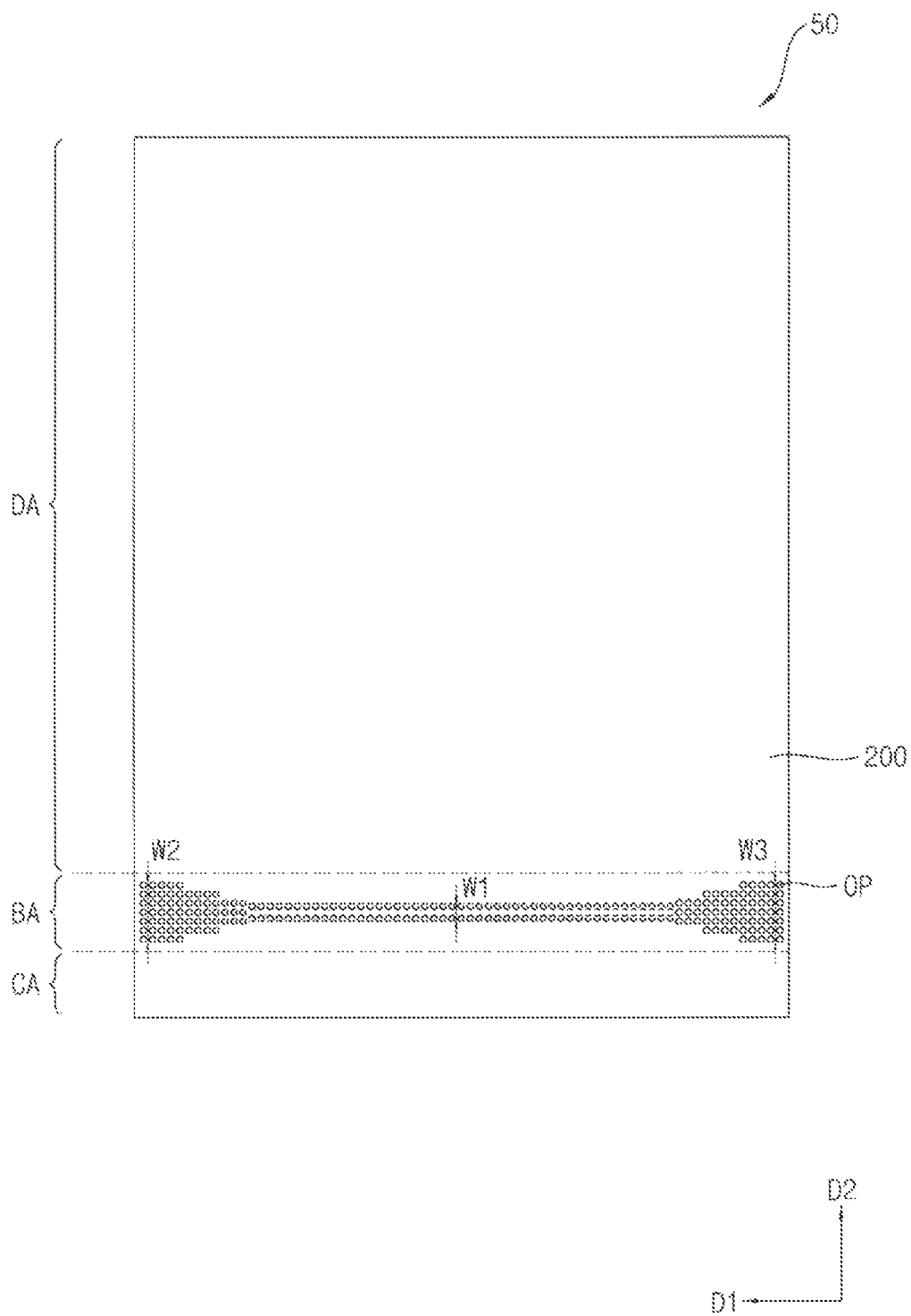
FIG. 7 is a bottom view illustrating a display device according to another exemplary embodiment.

FIG. 7 is a bottom view illustrating a display device 40 according to another exemplary embodiment.

Referring to FIG. 7, the display device 40 can be substantially the same as the display device 20 of FIGS. 5A and 5B except for openings OP of a protecting layer 200. Thus, any further detailed descriptions concerning the same elements will be briefly described or omitted.

The display device 40 includes a base substrate, a buffer layer, a first and second thin film transistors, a first insulation layer, a data pattern, a second insulation layer, a planarization layer, a first electrode, a pixel defining layer, a light emitting structure, a second electrode, a sealing layer and a protecting layer 200.

The display device 40 can include a display area DA, a circuit area CA and a bending area BA.

A plurality of openings OP can be formed through the protecting layer 200 in the bending area BA. For example, an area where the openings OP are formed can have a first width w1 at a central portion, and have a second width w2 and a third width w3 at the both end portions, so that the area can have a curved side. The first width w1 can be smaller than the second width w2 and the third width w3. Thus, the width of the area where the openings OP are formed can be greater at the both end portions than at the central portions.

When the bending area BA of the display device is bent, stress can generally be concentrated at both end portions of the bending area BA in the first direction D1. The width of the area where the openings OP are formed is larger at the both end portions, so that stress can be distributed. Accordingly, damage caused by bending can be reduced.

An adhesive layer (not shown) can further be disposed between the protecting layer 200 and the base substrate 100. The adhesive layer can include pressure-sensitive adhesive. Accordingly, the protecting layer 200 with the adhesive layer attached thereon and the openings OP formed therethrough can be attached on the bottom surface of the base substrate 100, so that the display device can be formed.

Figure 8A:
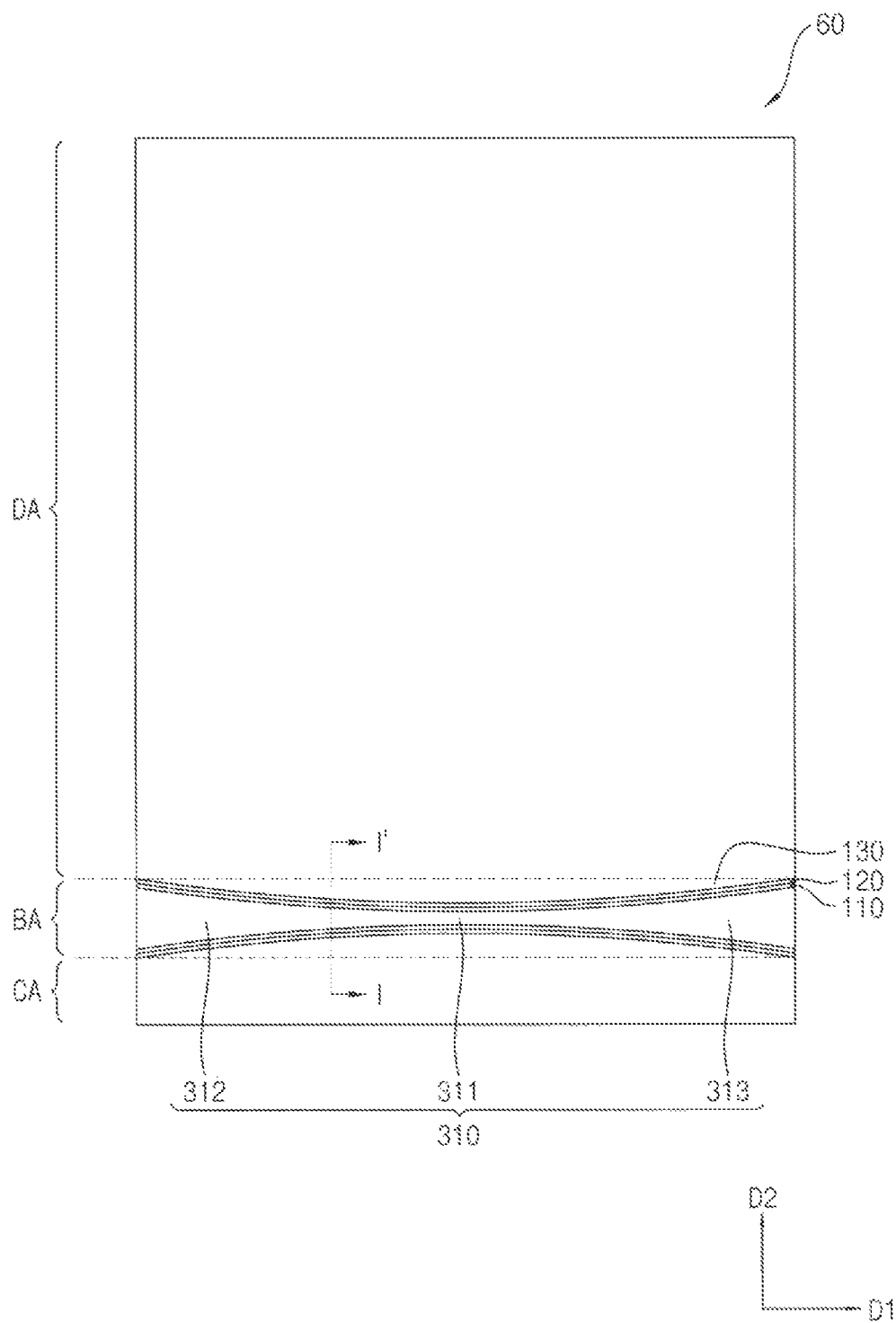
FIG. 8A is a plan view illustrating a display device according to another exemplary embodiment.

FIG. 8A is a plan view illustrating a display device 50 according to another exemplary embodiment. FIG. 8B is a cross-sectional view taken along a line I-I' of FIG. 8A.

Referring to FIGS. 8A and 8B, the display device 50 can be substantially the same as the display device 10 of FIGS. 1A and 1B except for a buffer layer 110, a first insulation layer 120, a second insulation layer 130 and a connecting wire CW. Thus, any further detailed descriptions concerning the same elements will be briefly described or omitted.

The display device 50 includes a base substrate 100, a buffer layer 110, a first and second thin film transistors TFT1 and TFT2, a first insulation layer 120, a gate pattern, a second insulation layer 130, a data pattern, a planarization layer 140, a first electrode EL1, a pixel defining layer 150, a light emitting structure 160, a second electrode EL2 and a sealing layer 170.

The base substrate 100 can include a flexible insulation substrate.

The buffer layer 110 can be disposed on the base substrate 100. The buffer layer 110 can be formed using a silicon compound. An active pattern can be disposed on the buffer layer 110. The active pattern can include a first active pattern ACT1 of the first thin film transistor TFT1 and a second active pattern ACT2 of the second thin film transistor TFT2. The first insulation layer 120 can be disposed on the buffer layer 110 to cover the active pattern. The first insulation layer 120 can be formed of an inorganic insulation material. The gate pattern can be disposed on the first insulation layer 120. The gate pattern can include a first gate electrode GE1 of the first thin film transistor TFT1 and a second gate electrode GE2 of the second thin film transistor TFT2. The second insulation layer 130 can be disposed on the first insulation layer 120 to cover the gate pattern. The second insulation layer 130 can include an inorganic insulation material.

A stress distribution area 300 can be formed by removing a portion of the buffer layer 110, a portion of the first insulation layer 120 and a portion of the second insulation layer 130. For example, openings are formed through the buffer layer 110, the first insulation layer 120 and the second insulation layer 130 in the stress distribution area 300. Here, the width of the opening of the buffer layer 110 is smaller than the width of the opening of the first insulation layer 120, and the width of the opening of the first insulation layer 120 is smaller than the width of the opening of the second insulation layer 130. Thus, the opening of the buffer layer 110, the opening of the first insulation layer 120 and the opening of the third insulation layer 130 can form steps in a cross-sectional view.

The data pattern can be disposed on the second insulation layer 130. The data pattern can include a first source electrode SE1 and a first drain electrode DE1 of the first thin film transistor TFT1, a second source electrode SE2 and a second drain electrode DE2 of the second thin film transistor TFT2, and a connecting wire CW.

The connecting wire CW can be disposed on the second insulation layer 130, and disposed on the base substrate 100 in the stress distribution area 300. In the stress distribution area 300, the buffer layer 110, the first insulation layer 120 and the second insulation layer 130 forms the opening having a stepwise shape, so that the connecting wire CW can make contact with the second insulation layer 130, the first insulation layer 120, the buffer layer 110 and an upper surface of the base substrate 100. Accordingly, the first thin film transistor TFT1 in the display area DA and the second thin film transistor TFT2 in the circuit area CA can be electrically connected to each other by the connecting wire CW.

The connecting wire CW can be formed in the stepwise shape in the stress distribution area 300. Thus, when the bending area BA is bent, damage on the connecting wire CW can be reduced.

FIGS. 9A to 9G are cross-sectional views illustrating a method of manufacturing the display device of FIGS. 1A and 1B.

Figure 9A:
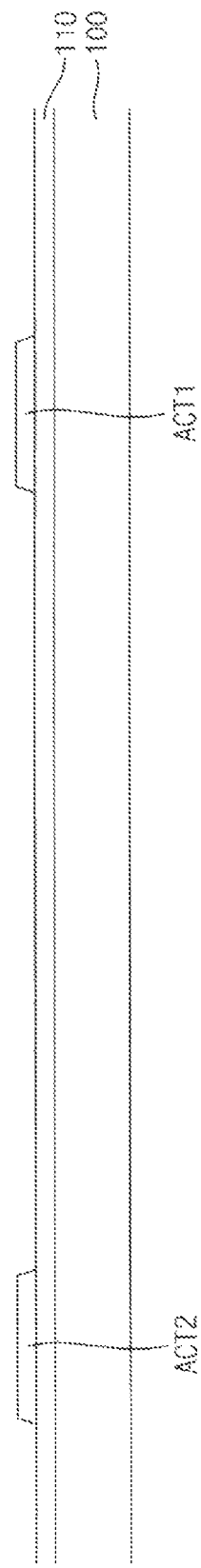

Referring to FIG. 9A, a buffer layer 110 is obtained on the base substrate 100 by a spin coating process, a chemical vapor deposition (CVD) process, a plasma enhanced chemical vapor deposition (PECVD) process, a high density plasma-chemical vapor deposition (HDP-CVD) process, a printing process, etc.

And then, an active pattern including a first active pattern ACT1 and a second active pattern ACT2 can be formed on the buffer layer 110. In example embodiments, a semiconductor layer (not illustrated) is formed on the buffer layer 110, and then a preliminary active layer (not illustrated) is formed on the buffer layer 110 by patterning the semiconductor layer. The crystallization process can be performed about the preliminary active layer to form the active pattern on the buffer layer 110. Here, the semiconductor layer can be formed by a CVD process, a PECVD process, a low pressure chemical vapor deposition (LPCVD) process, a sputtering process, a printing process, etc. When the semiconductor layer includes amorphous silicon, the active pattern can include polysilicon. The crystallization process for forming the active pattern 100 can include a laser irradiation process, a thermal treatment process, a thermal process utilizing a catalyst, etc. In some example embodiments, a dehydrogenation process is performed about the semiconductor layer and/or the preliminary active layer after forming the semiconductor layer and/or the preliminary active layer on the buffer layer 110. The dehydrogenation process can reduce the hydrogen concentration of the semiconductor layer and/ or the preliminary active layer, so that the active pattern can have improved electrical characteristics.

Figure 9B:
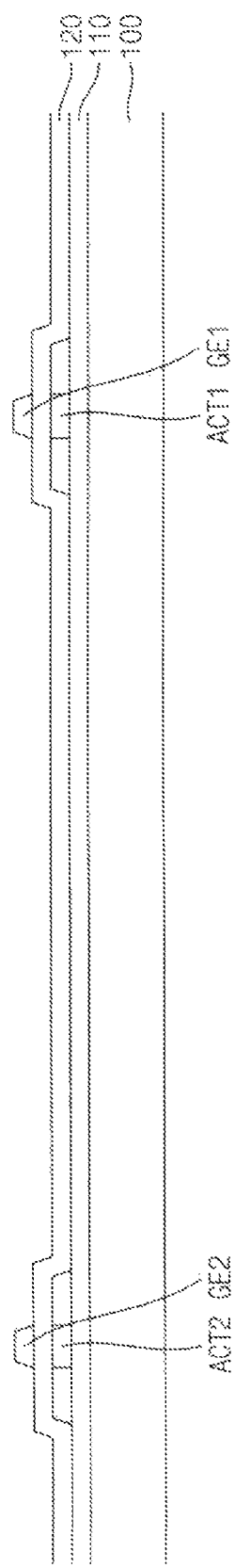

Referring to FIG. 9B, a first insulation layer 120 is formed on the buffer layer 110 on which the active pattern is formed.

The first insulation layer 120 can be formed by a CVD process, a spin coating process, a PECVD process, a sputtering process, a vacuum evaporation process, an HDP-CVD process, a printing process, etc.

And then a gate pattern including a first gate electrode GE1 and a second gate electrode GE2 can be formed on the first insulation layer 120. In example embodiments, a conductive layer (not illustrated) is formed on the first insulation layer 120, and then the conductive layer is partially etched by a photolithography process or an etching process using an additional etching mask. Hence, the gate pattern can be provided. The conductive layer can be formed by a printing process, a sputtering process, a CVD process, a pulsed laser deposition (PLD) process, a vacuum evaporation process, an atomic layer deposition (ALD) process, etc.

Referring to FIG. 9C, a second insulation layer 130 is formed on the first insulation layer 120 on which the gate pattern 120 is formed. The second insulation layer 140 can be formed by a CVD process, a spin coating process, a PECVD process, a sputtering process, a vacuum evaporation process, an HDP-CVD process, a printing process, etc.

Referring to FIG. 9D, contact holes CNT configured to expose the active pattern can be formed by partially etching the second insulation layer 130 and the first insulation layer 120 in a display area CA and a circuit area CA. In addition, opening corresponding to a stress distribution area 300 of a bending area BA can be formed by partially etching the second insulation layer 130, the first insulation layer 120 and the buffer layer 110.

Figure 9E:
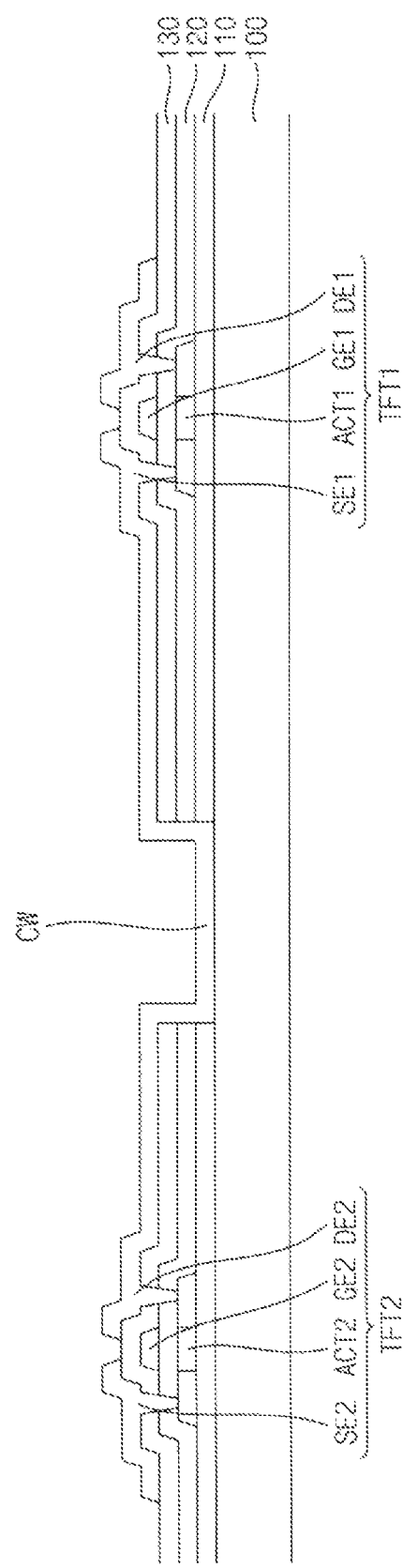

Referring to FIG. 9E, a data pattern can be formed on the second insulation layer 130. In example embodiments, a conductive layer (not illustrated) is formed on the second insulation layer 130, and then the conductive layer is partially etched by a photolithography process or an etching process using an additional etching mask. Hence, the data pattern can be provided. The conductive layer can be formed by a printing process, a sputtering process, a CVD process, a PLD process, a vacuum evaporation process, an ALD process, etc.

The data pattern can include a first source electrode SE1 and a first drain electrode DE1 of the first thin film transistor TFT1, a second source electrode SE2 and a second drain electrode DE2 of the second thin film transistor TFT2, and a connecting wire CW.

Figure 9F:
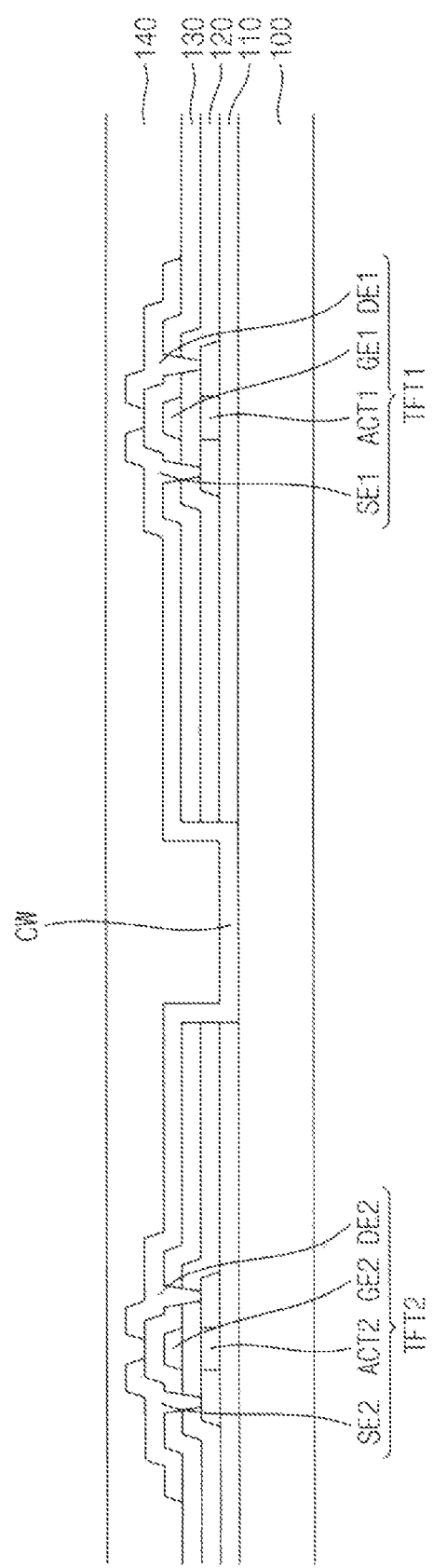

Referring to FIG. 9F, a planarization layer 140 is formed on the second insulation layer 140 and the base substrate 100. The planarization layer 140 can be formed to fill the opening in the stress distribution area.

In example embodiments, a planarization process is executed on the planarization layer 140 to enhance the flatness of the planarization layer 140. For example, the planarization layer 140 has a substantially level surface by a chemical mechanical polishing (CMP) process, an etchback process, etc. The planarization layer 140 can be formed using an organic material.

The planarization layer 140 can be obtained by a spin coating process, a printing process, a sputtering process, a CVD process, an ALD process, a PECVD process, an HDP-CVD process or a vacuum evaporation process in accordance with ingredients included in the planarization layer 140.

Figure 9G:
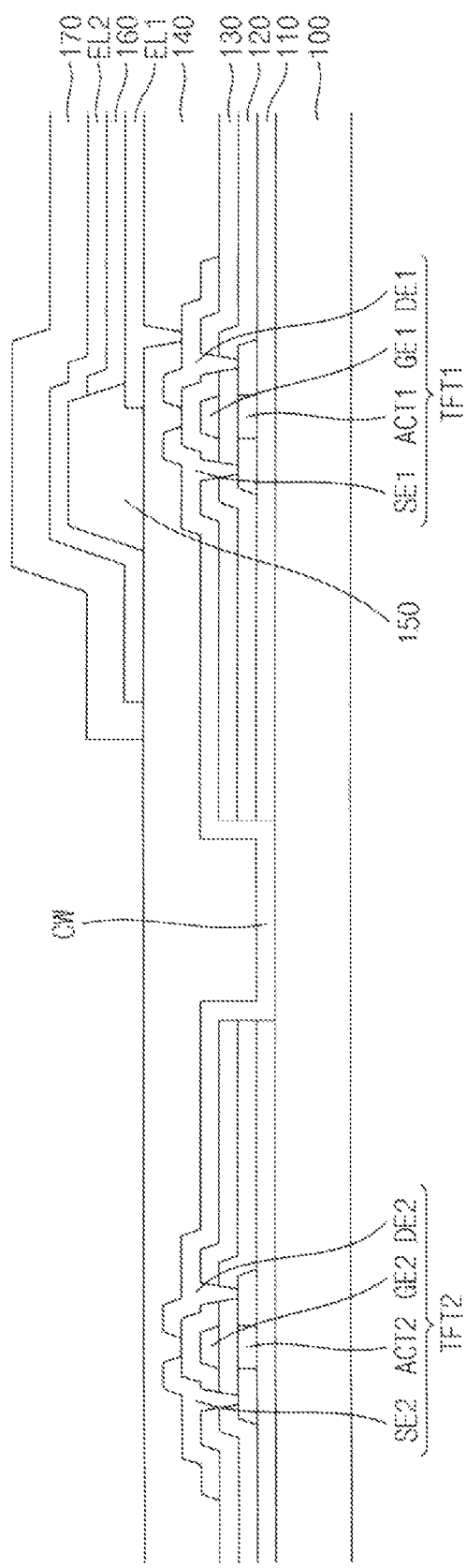

Referring to FIG. 9G, a first electrode EL1 is formed on the planarization layer 140.

A via hole can be formed through the planarization layer 140 to expose the first thin film transistor TFT1. And then, a conductive layer can be formed on the planarization layer 140, and then the conductive layer can be partially etched by a photolithography process or an etching process using an additional etching mask. Hence, the first electrode EL1 can be provided. Here, the conductive layer can be formed by a printing process, a sputtering process, a CVD process, a PLD process, a vacuum evaporation process, an ALD process, etc.

The first electrode EL1 can be electrically connected to the first thin film transistor TFT1 through the via hole of the planarization layer 140.

And then, a pixel defining layer 150 can be formed on the planarization layer 140 on which the first electrode EL1 is formed. The pixel defining layer 150 can be obtained by a spin coating process, a spray process, a printing process, a CVD process, a PECVD process, an HDP-CVD process, etc.

And then, a light emitting structure 160 can be formed on the first electrode EL1 exposed by an opening of the pixel defining layer 150. The light emitting structure 160 can be formed by a laser induced thermal imaging process, a printing process, etc.

And then, a second electrode EL2 can be formed on the light emitting structure 160 and the pixel defining layer 150. The second electrode EL2 can be formed by a printing process, a sputtering process, a CVD process, an ALD process, a vacuum evaporation process, a PLD process, etc.

And then a sealing layer 170 can be formed on the second electrode EL2.

According to at least one of the disclosed embodiments, a display device includes a display area and a bending area. The bending area can include a stress distribution area, and both end portions of the stress distribution area can have wider widths than the width at a central portion of the stress distribution area. Accordingly, when the bending area is bent, damage can be reduced due to the stress distribution area.

The foregoing embodiments are not to be construed as limiting thereof. Although a few exemplary embodiments have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims.

What is claimed is:

1. A display device comprising:
a display area configured to display an image;
a bending area adjacent to the display area, wherein the display device is bendable along the bending area;
a flexible base substrate;
a thin film transistor (TFT) disposed over the base substrate; and
an insulation layer disposed over the base substrate, the insulation layer formed of an inorganic insulation material,
wherein the bending area comprises a stress distribution region having opposing end portions and a central portion, wherein each of the opposing end portions has a width larger than the width of the central portion, and wherein the width of each opposing end increases as a function of distance from the central portion.

2. The display device of claim 1, wherein the insulation layer is not formed in the stress distribution region.

3. The display device of claim 2, further comprising:
a circuit area, wherein the bending area is interposed between the display area and the circuit area;
a first TFT disposed in the display area;
a second TFT disposed in the circuit area; and
a connecting wire disposed in the bending area and configured to electrically connect the first and second TFTs.

4. The display device of claim 3, wherein the first TFT comprises a first source electrode and a first drain electrode, wherein the second TFT comprises a second source electrode and a second drain electrode, and wherein the first and second source electrodes and the connecting wire are formed on the same layer and formed of the same material.

5. The display device of claim 4, wherein the insulation layer comprises:
a first insulation layer disposed over the base substrate and formed of the inorganic insulation material; and
a second insulation layer disposed over the first insulation layer and formed of the inorganic insulation material.

6. The display device of claim 5, further comprising a planarization layer disposed over the second insulation layer and entirely covering the display area and the bending area.

7. The display device of claim 5, wherein the first and second insulation layers together have a step shape in the stress distribution region.

8. The display device of claim 1, wherein the insulation layer has a plurality of openings formed in the stress distribution region.

9. The display device of claim 1, wherein the stress distribution region has a curved side.

10. The display device of claim 1, further comprising a protecting layer disposed over a bottom surface of the base substrate.

11. The display device of claim 10, wherein the protecting layer is not formed in the stress distribution region.

12. The display device of claim 10, wherein the protecting layer has a plurality of openings formed in the stress distribution region.

13. The display device of claim 10, wherein the display area comprises a first display area and a second display area spaced apart from each other, and wherein the bending area is interposed between the first and second display areas.

14. The display device of claim 1, wherein the inorganic insulation material includes silicon nitride or silicon oxide.

15. The display device of claim 1, wherein the bending area includes a portion of the insulation layer.

16. A method of manufacturing a display device which comprises a display area configured to display an image and a bending area which is bendable and disposed adjacent to the display area, the method comprising:
patterning a semiconductor layer to form a thin film transistor (TFT) over a base substrate;
forming an insulation layer formed of an inorganic insulation material; and
removing a portion of the insulation layer in the bending area so as to form a stress distribution region,
wherein the stress distribution region has opposing end portions and a central portion, wherein each of the opposing end portions has a width larger than the width of the central portion, and wherein the width of each opposing end increases as a function of distance from the central portion.

17. The method of claim 16, wherein the semiconductor layer is entirely removed in the stress distribution region.

18. The method of claim 17, further comprising forming a connecting wire over the insulation layer in the stress distribution region.

19. The method of claim 16, further comprising forming a plurality of openings in the insulation layer in the stress distribution region.

20. The method of claim 16, further comprising:
attaching a protecting layer over a bottom surface of the base substrate; and
forming a plurality of openings in the protecting layer in the stress distribution region.

21. A display device comprising:
a display area configured to display an image;
a bending area adjacent to the display area, wherein the display device is bendable along the bending area;
a flexible base substrate;
a thin film transistor (TFT) disposed over the base substrate; and
a pixel structure disposed over the base substrate and configured to display the image,
wherein the bending area includes a stress distribution region having opposing end portions and a central portion, wherein each of the opposing end portions has a width larger than the width of the central portion, wherein the width of each opposing end increases as a function of distance from the central portion, and wherein the width of the central portion is substantially uniform.

* * * * *